United States Patent [19]

Ishikawa

[11] Patent Number: 5,652,557
[45] Date of Patent: Jul. 29, 1997

[54] TRANSMISSION LINES AND FABRICATING METHOD THEREOF

[75] Inventor: Takahide Ishikawa, Itami, Japan

[73] Assignee: Mitsubishi Denki Kabushiki Kaisha, Tokyo, Japan

[21] Appl. No.: 544,196

[22] Filed: Oct. 17, 1995

[30] Foreign Application Priority Data

Oct. 19, 1994 [JP] Japan .................. 6-253631

[51] Int. Cl.$^6$ ...................................... H05K 1/00
[52] U.S. Cl. ..................... 333/243; 333/238; 333/246
[58] Field of Search ........................ 333/238, 246, 333/243

[56] References Cited

U.S. PATENT DOCUMENTS

| | | | |
|---|---|---|---|
| 3,225,351 | 12/1965 | Chatelain et al. | 343/872 |
| 4,482,873 | 11/1984 | Nyhus | 333/116 |
| 4,607,240 | 8/1986 | Isota et al. | 333/116 |
| 4,673,904 | 6/1987 | Landis | 333/238 |
| 4,772,864 | 9/1988 | Otto et al. | 333/238 |
| 4,918,049 | 4/1990 | Cohn et al. | 505/1 |
| 5,304,959 | 4/1994 | Wisherd et al. | 333/26 |
| 5,426,399 | 6/1995 | Matsubayashi et al. | 333/1 |

FOREIGN PATENT DOCUMENTS

| | | |
|---|---|---|
| 61-216448 | 9/1986 | Japan . |
| 61-224436 | 10/1986 | Japan . |
| 1125101 | 5/1989 | Japan . |

OTHER PUBLICATIONS

Translation of JP 1,125,101 into English pp. 1–9.
Lo et al, "Resonant Phenomena In Conductor-Backed Coplanar Wave-guides (CBCPW's)", IEEE Transactions on Microwave Theory and Techniques, vol. 41, No. 12, 1993, pp. 2099–2108.

Primary Examiner—Laura Thomas
Attorney, Agent, or Firm—Leydig, Voit & Mayer

[57] ABSTRACT

A transmission line including a dielectric or semi-insulating substrate; a groove in the substrate; a metallization film disposed on the bottom surface of the groove; a dielectric filling the groove and making contact with the metallization film; a wiring conductor film disposed on the dielectric; and a grounding metallization film disposed on the rear surface of the substrate. Excellent confinement of electromagnetic waves is achieved and electromagnetic wave interference between two neighboring lines is extremely small, realizing a high density arrangement of transmission lines and a compact and lightweight microwave/millimeter wave integrated circuit. Higher modes of electromagnetic wave propagation are avoided by controlling the thickness of the dielectric filling the groove while the thickness of the substrate remains arbitrary, thereby improving production yield and reliability.

35 Claims, 23 Drawing Sheets microstrip line side grounded wall line

TRANSMISSION LINES AND FABRICATING METHOD THEREOF

FIELD OF THE INVENTION

The present invention relates to a transmission line and, more particularly, to a transmission line for a microwave/millimeter wave integrated circuit having high isolation.

BACKGROUND OF THE INVENTION

FIG. 42 illustrates prior art transmission lines for a microwave/millimeter wave integrated circuit. In the figure, a microstrip line which is generally used is illustrated as an example. In FIG. 42, reference numeral 1 designates a dielectric or a semi-insulating semiconductor substrate, reference numeral 2 designates a grounded conductor formed on the rear surface of the substrate 1, and reference numeral 3 designates a microstrip conductor. The transmission line fabricated thereby has the advantage of easy fabrication. However, since it has an open structure, its confinement of an electromagnetic wave becomes poor.

FIGS. 43(a)–43(b) are schematic views describing difficulties concerning the transmission line of the prior art microwave/millimeter wave integrated circuit. The arrows in the figures represent electric field lines. As illustrated in FIG. 43(a), it is known that, if a plurality of lines are formed in close proximity of each other, electromagnetic wave interference between the lines, also known as crosstalk, occurs. Therefore, the lines of the microwave/millimeter wave integrated circuit are generally arranged with sufficient distance between the lines 3 as illustrated in FIG. 43(b).

Furthermore, it is known that a microstrip line produces higher order modes of propagation of an electromagnetic wave in an ultra high frequency band. In order to avoid the occurrence of these higher order modes of electromagnetic wave propagation, it is necessary to reduce the thickness of the substrate and the width of the strip conductor. However, in the case of a GaAs substrate, the thickness of the substrate has to be 30 μm or less in a 500 GHz band. The production of a substrate whose thickness is 30 μm or less is extremely difficult, and even if it is produced, the reliability of the integrated circuit is considerably reduced.

Since a prior art transmission line for a microwave/millimeter wave integrated circuit is structured as described above, the following difficulties arise.

1. If a plurality of lines are in close proximity of each other, electromagnetic wave interference, i.e., crosstalk, results. In order to avoid it, the chip size must increase and the production cost rises.

2. In order to avoid the occurrence of higher order modes of electromagnetic wave propagation in a transmission line for an ultra high frequency band, it is necessary to significantly reduce the thickness of the substrate, and this considerably deteriorates the production yield and the reliability of the integrated circuit.

SUMMARY OF THE INVENTION

It is an object of the present invention to provide a transmission line which does not produce electromagnetic wave interference even if a plurality of lines are arranged in close proximity of each other, and which has high isolation so that higher order modes of electromagnetic wave propagation can be avoided with an arbitrary thickness of the substrate when used for an ultra high frequency wave, and a fabricating method thereof.

Other objects and advantages of the invention will become apparent from the detailed description that follows.

The detailed description and specific embodiments described are provided only for illustration since various additions and modifications within the scope of the invention will be apparent to those of skill in the art from the detailed description.

A transmission line having high isolation according to the present invention has a structure which includes a side grounded wall in addition to a grounded conductor which a regular microstrip has, and a wiring conductor constituting a transmission line is formed on a dielectric for confining an electromagnetic wave having the same or a different dielectric constant from a dielectric substrate or semi-insulating semiconductor substrate, making contact with the grounded conductor, thereby improving an electromagnetic wave confinement effect. The occurrence of higher modes of electromagnetic wave propagation can be avoided by controlling the thickness of the dielectric for confining an electromagnetic wave with an arbitrary thickness of the substrate. Furthermore, a transmission line which is connected to other microwave/millimeter wave devices as easily as a prior art transmission line can be obtained.

According to a first aspect of the present invention, a transmission line in which a wiring conductor is disposed on a substrate comprises a dielectric substrate or a semi-insulating substrate having a front surface and a rear surface; a groove having bottom and lateral surfaces and formed on the front surface of the substrate; a first metallization film disposed on the bottom and the lateral surfaces of the groove; a dielectric filling the groove, making contact with the first metallization film, and having the same or a different dielectric constant from that of the substrate; a wiring conductor film disposed at the uppermost part of the dielectric; and a metallization film for grounding disposed on the rear surface of the substrate. Therefore, since the side grounded wall prevents an electromagnetic field from leaking in the transverse direction, the distance between two neighboring lines can be made extremely small. Furthermore, by controlling the thickness of the burying dielectric, the occurrence of higher order modes of an electromagnetic wave can be avoided while the thickness of the substrate remains arbitrary.

According to a second aspect of the present invention, the transmission line described as the first aspect of the present invention further comprises a via hole penetrating from the rear surface of the substrate, the via hole grounding the first metallization film disposed on the bottom surface of the groove. Therefore, an ideal ground characteristic can be obtained.

According to a third aspect of the present invention, in the transmission line described as the first aspect of the present invention, a plurality of transmission lines each comprising the groove, the first metallization film, the dielectric, and the wiring conductor are formed on the single substrate; a metallization film for grounding is formed on the rear surface of the substrate; and two different kinds or more of dielectric materials are disposed in a plurality of the grooves such that the dielectrics differ from one groove to another. Therefore, transmission lines having different line characteristics can be fabricated while the distance between two neighboring lines can be made extremely small.

According to a fourth aspect of the present invention, the transmission line described as the first aspect of the present invention further comprises a second dielectric having front and lateral surfaces, disposed on and making contact with the burying dielectric and the wiring conductor; a second metallization film disposed on and making contact with the front and the lateral surfaces of the second dielectric; and the second metallization film being connected to the first metallization film. Therefore, since the transmission line is sealed by the metallization film, the leakage of an electromagnetic field in the transverse and the longitudinal directions can be better prevented, realizing high isolation and better transmission efficiency.

According to a fifth aspect of the present invention, the transmission line described as the second aspect of the present invention further comprises a second dielectric having front and lateral surfaces, disposed on and making contact with the burying dielectric and the wiring conductor; and a second metallization film disposed on and making contact with the front and the lateral surfaces of the second dielectric; the second metallization film and the first metallization film being connected. Therefore, the leakage of an electromagnetic field in the transverse and the longitudinal directions is better prevented in a state of an ideal ground characteristic, realizing high isolation and better transmission efficiency.

According to a sixth aspect of the present invention, the transmission line described as the third aspect of the present invention further comprises a second dielectric having front and lateral surfaces, disposed on and making contact with the burying dielectric and the wiring conductor; and a second metallization film disposed on and making contact with the front and the lateral surfaces of the second dielectric; the second metallization film and the first metallization film being connected. Therefore, since the transmission lines are sealed by the metallization film, the leakage of an electromagnetic field in the transverse and the longitudinal directions is better prevented, realizing high isolation and better transmission efficiency for each transmission line of different line characteristics.

According to a seventh aspect of the present invention, in the transmission line described as the fourth aspect of the present invention, the second dielectric is replaced with an air layer. Therefore, the dielectric constant of the transmission line becomes small and the attenuation of an electromagnetic wave can be reduced.

According to an eighth aspect of the present invention, the transmission line described as the first aspect of the present invention further comprises a dielectric segment having conductivity and replacing a portion of the upper part of the burying dielectric filling the groove at an end of the transmission line, the resistance of the dielectric having conductivity at the end of the transmission line matching the characteristic impedance of the transmission line. Therefore, a transmission line constituting an end resistor for an ultra high frequency wave transmission line can be obtained.

According to a ninth aspect of the present invention, the transmission line described as the first aspect of the present invention further comprises a metal segment replacing a portion of the upper part of the burying dielectric filling the groove at an end of the transmission line, the wiring conductor film and the first metallization film being shorted by this metal segment. Therefore, a transmission line constituting a short circuit for an ultra high frequency wave transmission line can be obtained.

According to a tenth aspect of the present invention, in the transmission line described as the first aspect of the present invention, the length of the wiring conductor film is less than the length of the groove. Therefore, a transmission line constituting an open stub for an ultra high frequency wave transmission line can be obtained.

According to an eleventh aspect of the present invention, in the transmission line described as the first aspect of the present invention, the transmission line comprising the groove, the first metallization film, the dielectric, and the wiring conductor film branches into a T-shape. Therefore, a transmission line constituting a T-shaped branch circuit can be obtained.

According to a twelfth aspect of the present invention, the transmission line described as the first aspect of the present invention further comprises a first microstrip line disposed in the vicinity of the transmission line; and a second microstrip line of a line length of $(\frac{1}{4})\lambda$ and having a characteristic impedance of $Z_c = [(Z_{o1})(Z_{o2})]^{1/2}$, disposed between the transmission line and the first microstrip line; the second microstrip line connecting the transmission line to the first microstrip line, where $Z_{o1}$ represents the characteristic impedance of the burying dielectric line and $Z_{o2}$ represents the characteristic impedance of the first microstrip line. Therefore, a transmission line constituting a line impedance matching circuit can be obtained.

According to a thirteenth aspect of the present invention, in the transmission line described as the first aspect of the present invention, the dielectric filling the groove has homogeneous conductivity. Therefore, a transmission line constituting a transmission line type attenuator for an ultra high frequency wave can be obtained.

According to a fourteenth aspect of the present invention, a transmission line in which a wiring conductor is disposed on a substrate comprises a dielectric substrate or a semi-insulating substrate having a front surface and a rear surface; a metallization layer formed on the front surface of the substrate; a groove having bottom and lateral surfaces and formed on the surface of the metallization layer; a dielectric filling the groove having the same or different dielectric constant from that of the substrate; and a wiring conductor film disposed on the upper surface of the dielectric. Therefore, the lateral surfaces of the groove disposed on the metallization layer prevents an electromagnetic field from leaking in the transverse direction, and the distance between two neighboring lines can be made extremely small. Furthermore, by controlling the thickness of the dielectric for confining the electromagnetic wave, the occurrence of higher order modes of an electromagnetic wave can be avoided while the thickness of the substrate remains arbitrary.

According to a fifteenth aspect of the present invention, the transmission line described as the fourteenth aspect of the present invention further comprises a via hole penetrating from the rear surface of the substrate, the via hole grounding the metallization layer disposed on the front surface of the substrate. Therefore, an ideal ground characteristic can be obtained.

According to a sixteenth aspect of the present invention, in the transmission line described as the fourteenth aspect of the present invention, a plurality of transmission lines each comprising the groove, the dielectric, and the wiring conductor are formed on the metallization layer; a metallization film for grounding is disposed on the rear surface of the substrate; and two different kinds or more of dielectric materials are disposed in a plurality of the grooves such that the dielectrics differ from one groove to another. Therefore, transmission lines having different line characteristics can be fabricated while the distance between two neighboring lines can be made extremely small.

According to a seventeenth aspect of the present invention, the transmission line described as the fourteenth aspect of the present invention further comprises a second dielectric having front and lateral surfaces, disposed on and making contact with the burying dielectric and the wiring conductor; and a second metallization film disposed on and making contact with the front and the lateral surfaces of the second dielectric; the second metallization film being connected to the metallization layer. Therefore, since the transmission line is sealed by the second metallization film, the leakage of an electromagnetic field in the transverse and the longitudinal directions can be better prevented, realizing high isolation and better transmission efficiency.

According to an eighteenth aspect of the present invention, the transmission line described as the fifteenth aspect of the present invention further comprises a second dielectric having front and lateral surfaces, disposed on and making contact with the burying dielectric and the wiring conductor; and a second metallization film disposed on and making contact with the front and the lateral surfaces of the second dielectric; the second metallization film and the metallization layer being connected. Therefore, the leakage of an electromagnetic field in the transverse and the longitudinal directions is better prevented in a state of an ideal ground characteristic, realizing high isolation and better transmission efficiency.

According to a nineteenth aspect of the present invention, the transmission line described as the sixteenth aspect of the present invention further comprises a second dielectric having front and lateral surfaces, disposed on and making contact with the burying dielectric and the wiring conductor; and a second metallization film disposed on and making contact with the front and the lateral surfaces of the second dielectric; the second metallization film and the metallization layer being connected. Therefore, since the transmission lines are sealed by the second metallization film, the leakage of an electromagnetic field in the transverse and the longitudinal directions is better prevented, realizing high isolation and better transmission efficiency for each transmission line of different line characteristics.

According to a twentieth aspect of the present invention, in the transmission line described as the seventeenth aspect of the present invention, the second dielectric is replaced with an air layer. Therefore, the dielectric constant of the transmission line becomes small and the attenuation of an electromagnetic wave can be reduced.

According to a twenty-first aspect of the present invention, the transmission line described as the fourteenth aspect of the present invention further comprises a dielectric segment having conductivity and replacing a portion of the upper part of the burying dielectric filling the groove at an end of the transmission line, the resistance of the dielectric having conductivity at the end of the transmission line matching the characteristic impedance of the transmission line. Therefore, a transmission line constituting an end resistor for an ultra high frequency wave transmission line can be obtained.

According to a twenty-second aspect of the present invention, the transmission line described as the fourteenth aspect of the present invention further comprises a metal segment replacing a portion of the upper part of the burying dielectric filling the groove at an end of the transmission line, the wiring conductor film and the metallization layer being shorted by the metal segment. Therefore, a transmission line constituting a short circuit for an ultra high frequency wave transmission line can be obtained.

According to a twenty-third aspect of the present invention, in the transmission line described as the fourteenth aspect of the present invention, the length of the wiring conductor film is less than the length of the groove. Therefore, a transmission line constituting an open stub for an ultra high frequency wave transmission line can be obtained.

According to a twenty-fourth aspect of the present invention, in the transmission line described as the fourteenth aspect of the present invention, the transmission line comprising the groove, the dielectric, and the wiring conductor film branches into a T-shape. Therefore, a transmission line constituting a T-shaped branch circuit can be obtained.

According to a twenty-fifth aspect of the present invention, the transmission line described as the fourteenth aspect of the present invention further comprises a first microstrip line disposed in the vicinity of the transmission line; and a second microstrip line of a line length of ($\frac{1}{4}$)$\lambda$ and having a characteristic impedance of $Z_c=[(Z_{o1})(Z_{o2})]^{1/2}$, disposed between the transmission line and the first microstrip line; the second microstrip line connecting the transmission line to the first microstrip line, where $Z_{o1}$ represents the characteristic impedance of the burying dielectric line and $Z_{o2}$ represents the characteristic impedance of the first microstrip line. Therefore, a transmission line constituting a line impedance matching circuit can be obtained.

According to a twenty-sixth aspect of the present invention, in the transmission line described as the fourteenth aspect of the present invention, the dielectric filling the groove has homogeneous conductivity. Therefore, a transmission line constituting a transmission line type attenuator for an ultra high frequency wave can be obtained.

According to a twenty-seventh aspect of the present invention, a method of fabricating a transmission line in which a wiring conductor is disposed on a substrate comprises preparing a dielectric or a semi-insulating substrate having a front surface and a rear surface; forming a groove having bottom and lateral surfaces on the front surface of the substrate; forming a first metallization film on the bottom and the lateral surfaces of the groove; filling the groove with a dielectric having the same or a different dielectric constant from that of the substrate, making contact with the first metallization film; forming a wiring conductor film at the uppermost part of the dielectric; and forming a metallization film for grounding on the rear surface of the substrate. Therefore, since the side grounded wall prevents an electromagnetic field from leaking in the transverse direction, the distance between two neighboring lines can be made extremely small. Furthermore, a transmission line having high isolation and capable of avoiding the occurrence of higher order modes of an electromagnetic wave by controlling the thickness of the burying dielectric while the thickness of the substrate remains arbitrary can be obtained.

According to a twenty-eighth aspect of the present invention, the method of fabricating the transmission line described as the twenty-seventh aspect of the present invention further comprises forming a via hole from the rear surface of the substrate which grounds the first metallization film formed on the bottom surface of the groove. Therefore, a transmission line having an ideal ground characteristic and high isolation can be obtained.

According to a twenty-ninth aspect of the present invention, the method of fabricating the transmission line described as the twenty-seventh aspect of the present invention further comprises forming a plurality of transmission lines comprising the groove, the first metallization film, the dielectric, and the wiring conductor on the single substrate; forming a metallization film for grounding on the rear surface of the substrate; and filling each groove with dielectric materials which differ from one groove to another. Therefore, transmission lines having high isolation and in which a plurality of transmission lines having different line characteristics can be fabricated while the distance between two neighboring lines is made extremely small can be obtained.

According to a thirtieth aspect of the present invention, the transmission line described as the twenty-seventh aspect of the present invention further comprises forming a second dielectric having front and lateral surfaces on the burying dielectric and the wiring conductor; and forming the second metallization film on the front and the lateral surfaces of the second dielectric such that the second metallization film is connected to the first metallization film. Therefore, since the transmission line is sealed by the second metallization film, the leakage of an electromagnetic field in the transverse and the longitudinal directions can be better prevented and, consequently, a transmission line having high isolation and better transmission efficiency can be obtained.

According to a thirty-first aspect of the present invention, the method of fabricating the transmission line described as the twenty-seventh aspect of the present invention further comprises removing a portion of the upper part of the burying dielectric filling the groove at an end of the transmission line; and filling the space where the portion of the dielectric is removed with a dielectric having conductivity and whose resistance matches the characteristic impedance of the transmission line. Therefore, a transmission line having high isolation and constituting an end resistor for an ultra high frequency wave transmission line can be obtained.

According to a thirty-second aspect of the present invention, the method of fabricating the transmission line described as the twenty-seventh aspect of the present invention further comprises removing a portion of the upper part of the burying dielectric filling the groove at an end of the transmission line; and filling the space where the portion of the dielectric is removed with metal which electrically shorts the wiring conductor film and the first metallization film. Therefore, a transmission line having high isolation and constituting a short circuit for an ultra high frequency wave transmission line can be obtained.

According to a thirty-third aspect of the present invention, in the method of fabricating the transmission line described as the twenty-seventh aspect of the present invention, when forming the wiring conductor film at the uppermost part of the dielectric, a wiring conductor film whose length is less than that of the groove is formed at the uppermost part of the dielectric. Therefore, a transmission line having high isolation and constituting an open stub for an ultra high frequency wave transmission line can be obtained.

According to a thirty-fourth aspect of the present invention, in the method of fabricating the transmission line described as the twenty-seventh aspect of the present invention, when forming the groove, the first metallization film, the dielectric, and the wiring conductor film, the groove, the first metallization film, the dielectric, and the wiring conductor film are formed into a T-shape. Therefore, a transmission line having high isolation and constituting a T-shaped branch circuit can be obtained.

According to a thirty-fifth aspect of the present invention, the method of fabricating the transmission line described as the twenty-seventh aspect of the present invention further comprises forming a first microstrip line in the vicinity of the transmission line; and forming a second microstrip line of a line length of $(\frac{1}{4})\lambda$ and having the characteristic impedance of $Z_c=[(Z_{o1})(Z_{o2})]^{1/2}$ between the transmission line and the first microstrip line, where $Z_{o1}$ represents the characteristic impedance of the burying dielectric line and $Z_{o2}$ represents the characteristic impedance of the first microstrip line, so that the second microstrip line connects the transmission line to the first microstrip line. Therefore, a transmission line having high isolation and constituting a line impedance matching circuit can be obtained.

According to a thirty-sixth aspect of the present invention, in the method of fabricating the transmission line described as the twenty-seventh aspect of the present invention, when filling the groove with a dielectric having the same or a different dielectric constant from that of the substrate, making contact with the first metallization film, the groove is filled with a dielectric having homogeneous conductivity, making contact with the first metallization film. Therefore, a transmission line having high isolation and constituting a transmission line type attenuator for an ultra high frequency wave can be obtained.

According to thirty-seventh aspect of the present invention, a method of fabricating a transmission line in which a wiring conductor is disposed on a substrate comprises preparing a dielectric or a semi-insulating substrate having a front surface and a rear surface; forming a metallization layer on the front surface of the substrate; forming a groove having bottom and lateral surfaces on the front surface of the metallization layer; filling the groove with a dielectric having the same or a different dielectric constant from that of the substrate; forming a wiring conductor film at the uppermost part of the dielectric; and forming a metallization film for grounding on the rear surface of the substrate. Therefore, since the side grounded wall prevents an electromagnetic field from leaking in the transverse direction, the distance between two neighboring lines can be made extremely small. Furthermore, a transmission line having high isolation and capable of avoiding the occurrence of higher order modes of an electromagnetic wave by controlling the thickness of the burying dielectric while the thickness of the substrate remains arbitrary can be obtained.

According to a thirty-eighth aspect of the present invention, the method of fabricating the transmission line described as the thirty-seventh aspect of the present invention further comprises forming a via hole from the rear surface of the substrate which grounds the metallization layer formed on the front surface of the substrate. Therefore, a transmission line having high isolation and an ideal ground characteristic can be obtained.

According to a thirty-ninth aspect of the present invention, the method of fabricating the transmission line described as the thirty-seventh aspect of the present invention further comprises forming a plurality of transmission lines comprising the groove, the dielectric, and the wiring conductor on the single substrate; forming a metallization film for grounding on the rear surface of the substrate; and filling each groove with dielectric materials which differ from one groove to another. Therefore, transmission lines having high isolation and in which a plurality of transmission lines having different line characteristics can be fabricated while the distance between two neighboring lines is made extremely small can be obtained.

According to a fortieth aspect of the present invention, the method of fabricating the transmission line described as the thirty-seventh aspect of the present invention further comprises forming a second dielectric having front and lateral surfaces on the burying dielectric and the wiring conductor; and forming the second metallization film on the front and the lateral surfaces of the second dielectric such that the second metallization film is connected to the metallization layer. Therefore, since the transmission line is sealed by the second metallization film, the leakage of an electromagnetic field in the transverse and the longitudinal directions can be better prevented and, consequently, a transmission line having high isolation and better transmission efficiency can be obtained.

According to a forty-first aspect of the present invention, the method of fabricating the transmission line described as the thirty-seventh aspect of the present invention further comprises removing a portion of the upper part of the burying dielectric filling the groove at an end of the transmission line; and filling the space where the portion of the dielectric is removed with a dielectric having conductivity and whose resistance matches the characteristic impedance of the transmission line. Therefore, a transmission line having high isolation and constituting an end resistor for an ultra high frequency transmission line can be obtained.

According to a forty-second aspect of the present invention, the method of fabricating the transmission line described as the thirty-seventh aspect of the present invention further comprises removing a portion of the upper part of the burying dielectric filling the groove at an end of the transmission line; and filling the space where the portion of the dielectric is removed with metal which electrically shorts the wiring conductor film and the metallization layer. Therefore, a transmission line having high isolation and constituting a short circuit for an ultra high frequency wave can be obtained.

According to a forty-third aspect of the present invention, in the method of fabricating the transmission line described as the thirty-seventh aspect of the present invention, when forming the wiring conductor film at the uppermost part of the dielectric, a wiring conductor film whose length is less than that of the groove is formed at the uppermost part of the dielectric. Therefore, a transmission line having high isolation and constituting an open stub for an ultra high frequency wave transmission line can be obtained.

According to a forty-fourth aspect of the present invention, in the method of fabricating the transmission line described as the thirty-seventh aspect of the present invention, when forming the groove, the dielectric, and the wiring conductor film, the groove, the dielectric, and the wiring conductor film are formed into a T-shape. Therefore, a transmission line having high isolation and constituting a T-shaped branch circuit can be obtained.

According to a forty-fifth aspect of the present invention, the method of fabricating the transmission line described as the thirty-seventh aspect of the present invention further comprises forming a first microstrip line in the vicinity of the transmission line; and forming a second microstrip line of a line length of ($\frac{1}{4}$)$\lambda$ and having the characteristic impedance of $Z_c=[(Z_{01})(Z_{02})]^{1/2}$ between the transmission line and the first microstrip line, where $Z_{01}$ represents the characteristic impedance of the burying dielectric line and $Z_{02}$ represents the characteristic impedance of the first microstrip line, so that the second microstrip line connects the transmission line to the first microstrip line. Therefore, a transmission line having high isolation and constituting a line impedance matching circuit can be obtained.

According to a forty-sixth aspect of the present invention, in the method of fabricating the transmission line described as the thirty-seventh aspect of the present invention, when filling the groove with a dielectric having the same or a different dielectric constant from that of the substrate, the groove is filled with a dielectric having homogeneous conductivity. Therefore, a transmission line having high isolation and constituting a transmission line type attenuator for an ultra high frequency wave can be obtained.

DETAILED DESCRIPTION OF THE PREFERRED EMBODIMENTS

Embodiment 1

Figure 1:
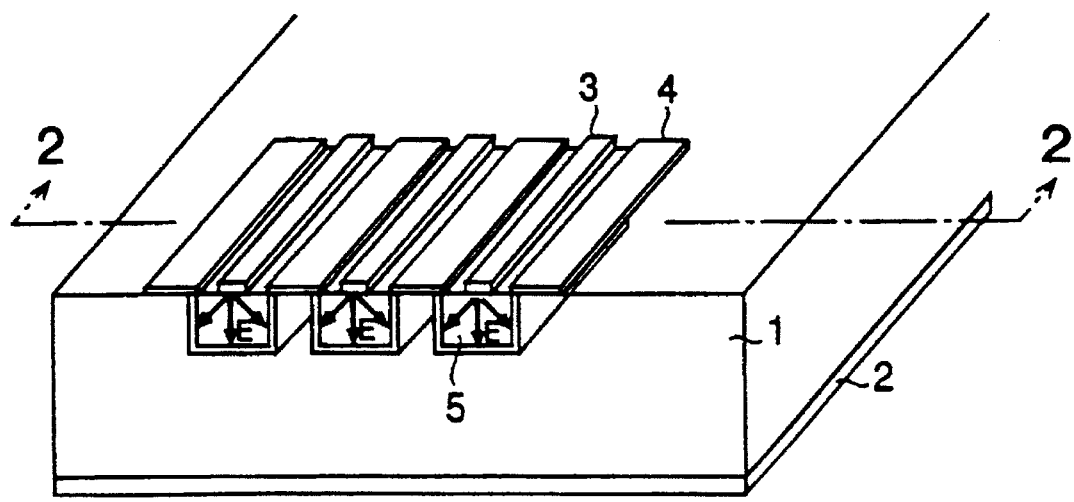
FIG. 1 is a perspective view illustrating transmission lines having high isolation according to a first embodiment of the present invention.
Figure 2:
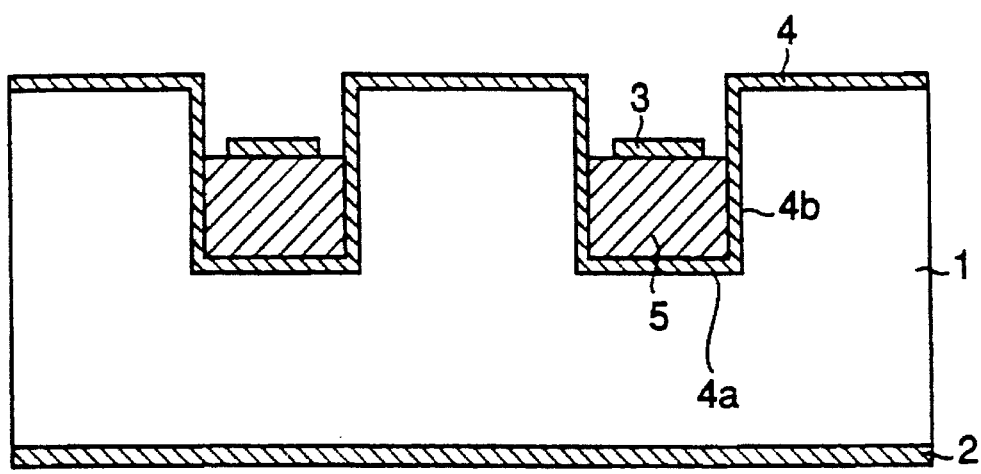
FIG. 2 is a cross-sectional view illustrating the transmission line having high isolation according to the first embodiment.
Figure 3:
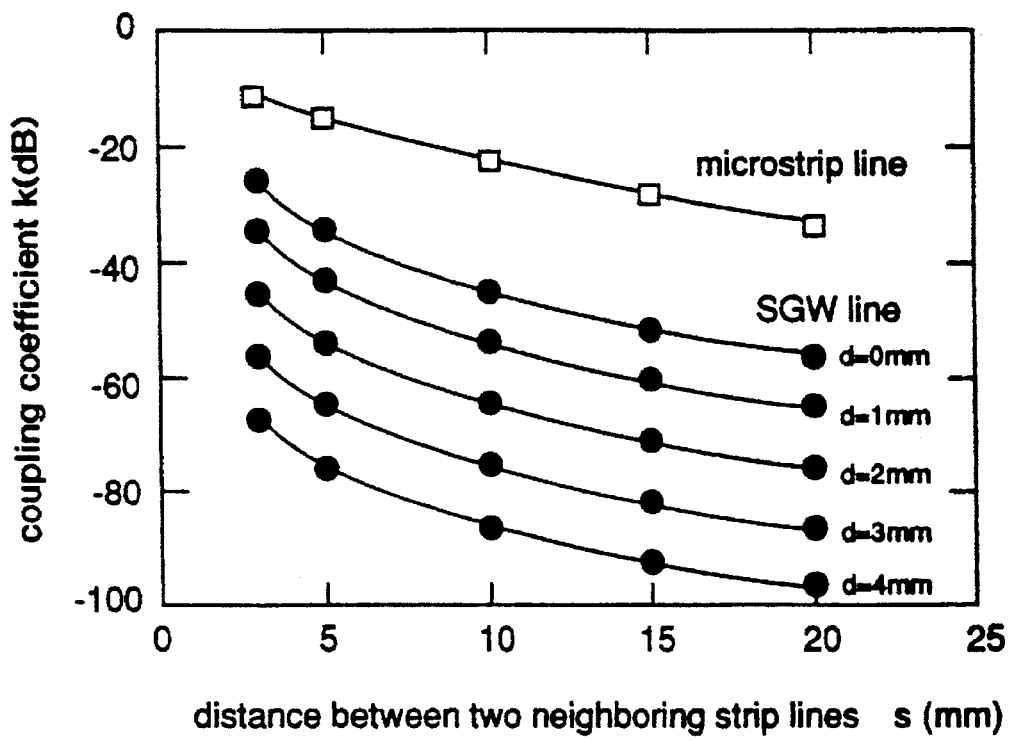
FIG. 3(a) is a graph illustrating the result of a calculation confirming the effectiveness of the first embodiment.
FIGS. 3(b)–(c) are diagrams illustrating a model incorporated into the calculation.
Figure 3:
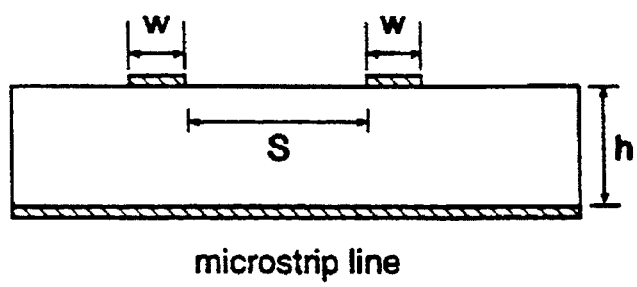
Figure 3:
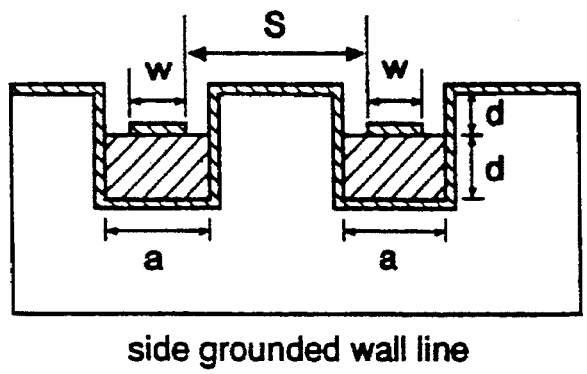

FIG. 1 is a perspective view illustrating transmission lines having high isolation according to a first embodiment of the present invention. In the figure, reference numeral 1 designates a dielectric or a semi-insulating semiconductor substrate, reference numeral 2 designates a grounded conductor formed on the rear surface of the substrate 1, reference numeral 3 designates a microstrip conductor line (referred to as a conductor line, hereinafter) formed on the front surface of the substrate 1, reference numeral 4 designates a first metallization film on the surface of a groove in the substrate 1 at the front surface, and reference numeral 5 designates a dielectric formed in the groove. The arrows E in the figure indicate electric field lines. FIG. 2 is a portion of the cross-sectional view taken along the line 2—2 in FIG. 1, where reference numerals designate the same parts as in FIG. 1. In this line structure, signals are transmitted through the region between the conductor line 3 and the bottom 4a of the first metallization film 4 in an electromagnetic wave mode similar to signal transmission through the region a microstrip line, and they are transmitted through between the conductor line 3 and the lateral surface 4b of the first metallization film 4 in a transmission mode of a coplanar line. It is easily inferred that the leakage of an electromagnetic wave in the transverse direction is inhibited by the presence of the lateral portion 4b of the first metallization film 4, and this is actually confirmed by a numerical calculation revealing that extremely high isolation is achieved. The result of the quasi-TEM wave analysis of coupling between the two lines having this line structure by the square boundary partition method introduced in "Analysis Method for Generalized Suspended Strip Lines", IEEE Transaction on Microwave Theory and Techniques, vol. MTT-34, No. 12, December in 1986 is illustrated in FIG. 3(a). The dimensions of each portion of the line used in the numerical analysis are shown in FIG. 3(b)–3(c). In the graph shown in FIG. 3(a), the abscissa represents a distance s between two strip lines and the ordinate represents coupling amounts (coupling coefficient) k between the two lines, both of which are plotted with a burying depth d as a parameter. The coupling coefficients between microstrip lines are also shown in this graph for comparison. As it is apparent from FIG. 3(a), the transmission line according to the first embodiment has larger isolation than the microstrip line by about −20 dB when the burying distance d=0, and this further increases as the burying distance d increases.

A method of fabrication will be described.

FIGS. 4(a)–4(e) are cross-sectional views describing a method of fabricating transmission lines of the first embodiment having high isolation.

Figure 4:
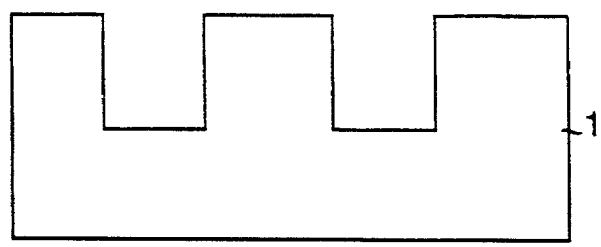
FIGS. 4(a)–4(e) are flow diagrams describing a method of fabricating the transmission lines having high isolation according to the first embodiment of the present invention.
Figure 4:
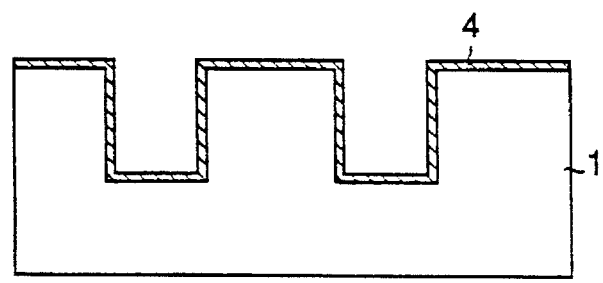
Figure 4:
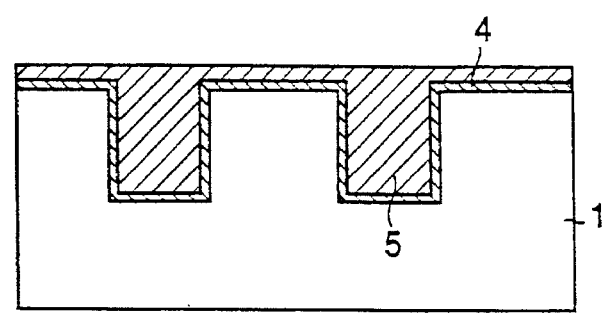
Figure 4:
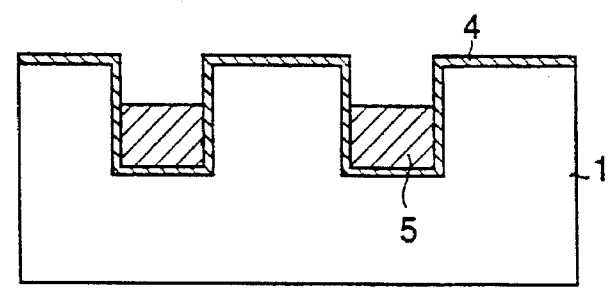
Figure 4:
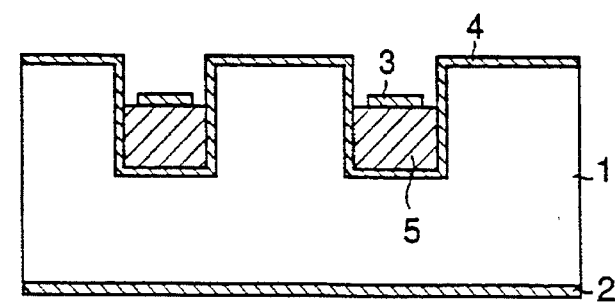

First, as shown in FIG. 4(a), a groove (the depth being 20–50 μm) is formed at the front surface of and in the substrate 1 such as a semiconductor substrate comprising GaAs, Si or the like or a ceramic substrate comprising sapphire or the like. For the formation of this groove, if the substrate is a semiconductor substrate, then wet etching or RIE (Reactive Ion Etching) is used, and if it is a ceramic substrate, then the substrate is mechanically ground by using a fabricating tool such as a dicing saw. Next, as shown in FIG. 4(b), the first metallization film 4 is formed on both the internal surface of the groove and the front surface of the substrate by depositing a good conductor such as Au, Cu, Ag preferably by sputtering or plating (if Au plating, for example, a thickness of 2–5 µm is to be achieved). Then, as shown in FIG. 4(c), the burying dielectric 5 (polyimide, SiO, SiN film, or strong dielectric such as barium titanate (BaTiO$_3$, $\epsilon_r$=5000) can be used) is deposited on the entire surface. Then, as shown in FIG. 4(d), the entire surface of the burying dielectric 5 is etched, preferably by RIE, leaving a prescribed thickness. Finally, the conductor line 3 of a metallization film is metallized on the burying dielectric 5, and the grounding conductor 2 is metallized on the rear surface of the substrate 1 (FIG. 4(e)). The metallization film which becomes the conductor line 3 can be obtained by forming, for example, a Ti/Au double layered metallization layer (a width of 10–200 µm, a thickness of 2–5 µm) by evaporation and lift-off, and the metallization film which becomes the grounded conductor 2 is obtained by forming a good conductor (a thickness of 2–5 µm) such as Au, Cu, and Ag on the rear surface of the substrate 1 preferably by sputtering or evaporation. In this fabricating process, although the grounded conductor 2 is not particularly needed for the transmission of an electromagnetic wave, it is formed to maintain good wettability for soldering since soldering is usually used when a substrate is adhered to a carrier or the like.

In the transmission line of the first embodiment, since the side grounded wall due to the first metallization film 4 prevents the leakage of an electromagnetic field in the transverse direction, even if the conductor lines are arranged in close proximity of each other, they do not produce interference. As a result, even if a distance between the neighboring lines is reduced, that is, even if a high density line arrangement is realized, high isolation can be obtained, thereby obtaining effects of low cost and reduction in chip size.

Although, in the case of microstrip conductor lines for an ultra high frequency wave, it is necessary to make the thickness of the substrate 30 µm or less in order to inhibit higher order modes of electromagnetic wave propagation from occurring, since the thickness of the burying dielectric 5 corresponds to the substrate thickness in the structure described in the first embodiment, it is only necessary to reduce the thickness of the burying dielectric 5 to 30 µm or less. Therefore, even if the thickness of the substrate 1 is arbitrarily chosen, the occurrence of higher order modes of electromagnetic wave propagation can be avoided, and effects such as improving production yield and reliability of an integrated circuit can be obtained.

Embodiment 2

Figure 5:
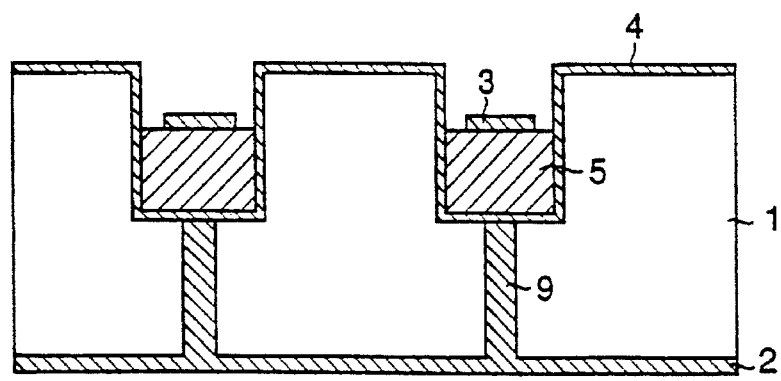
FIG. 5 is a cross-sectional view illustrating transmission lines having high isolation according to a second embodiment of the present invention.

FIG. 5 is a cross-sectional view illustrating a structure of transmission lines having high isolation according to a second embodiment of the present invention. In the figure, reference numeral 9 designates a via hole extending from the rear surface of the substrate 1.

The transmission line of the second embodiment includes the first embodiment, further including the via hole 9 which electrically connects the first metallization film 4 formed on the bottom of the groove on the substrate 1 and the grounded conductor 2 formed on the rear surface of the substrate 1.

A method of fabrication will be described.

Figure 6:
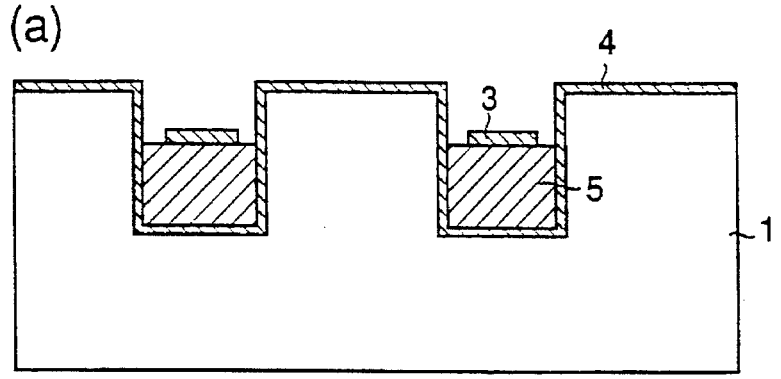
FIGS. 6(a)–6(c) are flow diagrams describing a method of fabricating the transmission lines having high isolation according to the second embodiment of the present invention.
Figure 6:
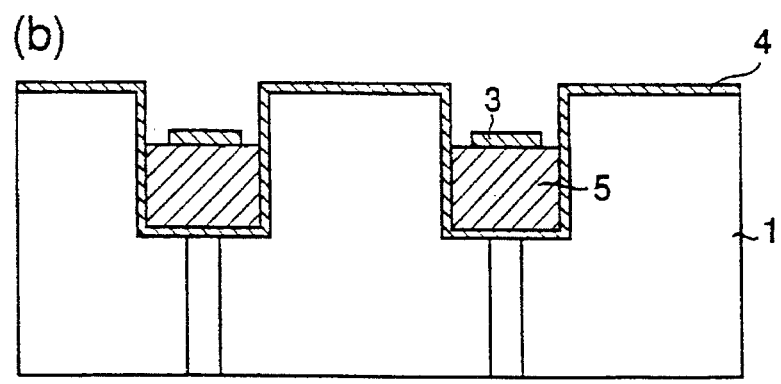
Figure 6:
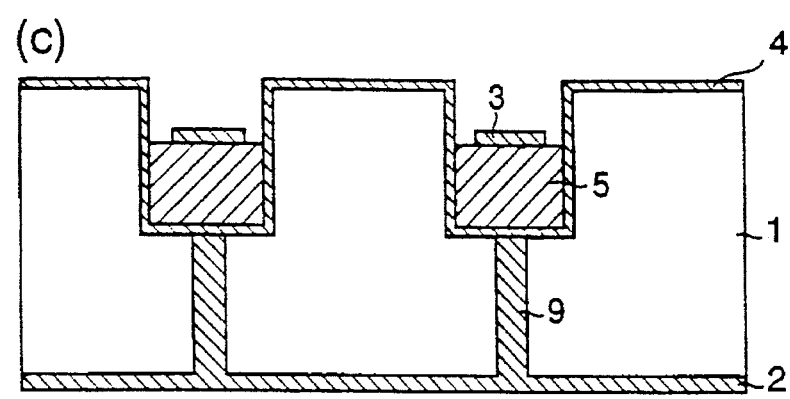

FIGS. 6(a)–6(c) are cross-sectional views describing a method of fabricating the transmission line having high isolation according to the second embodiment.

First, starting with the step shown in FIG. 4(d) of the first embodiment, a metallization film which becomes the conductor line 3 is formed on the burying dielectric 5 as illustrated in the FIG. 6(a), and then the via hole 9 with a diameter of 50 µm or greater is formed from the rear surface of the substrate toward the bottom of the first metallization film 4 as illustrated FIG. 6(b). This is an effective method when the substrate 1 comprises a semiconductor material and a via hole is easily formed using wet or dry etching. Finally, as shown in FIG. 6(c), the internal surface of the via hole and the rear surface of the substrate is metallized preferably by sputtering or plating.

In the transmission line of the second embodiment having high isolation, by connecting the first metallization film 4 to the grounded conductor 2 on the rear surface of the substrate, an ideal ground characteristic can be obtained and more stable transmission becomes possible.

Embodiment 3

Figure 7:
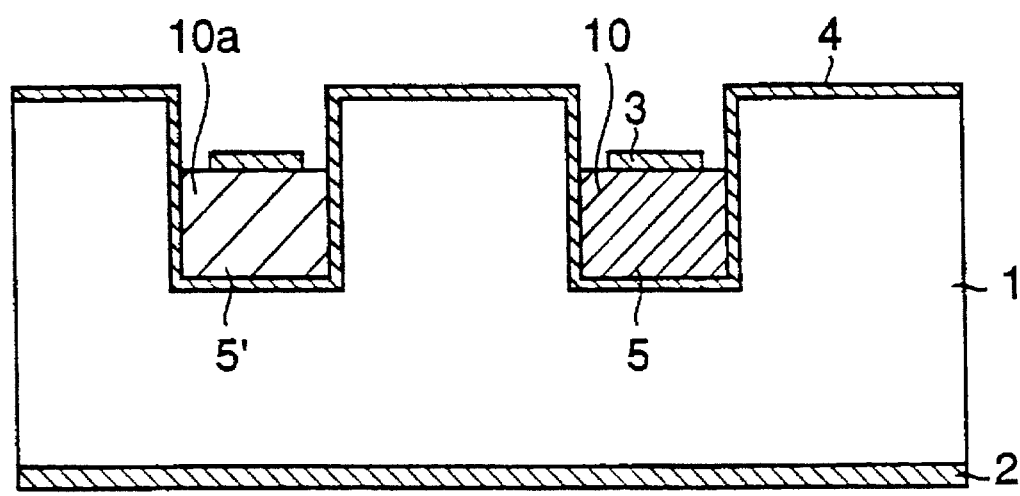
FIG. 7 is a cross-sectional view illustrating transmission lines having high isolation according to a third embodiment of the present invention.

FIG. 7 is a cross-sectional view illustrating a structure of a transmission line having high isolation according to a third embodiment of the present invention. In FIG. 7, reference numeral 5' designates a dielectric material formed in the groove 10a which differs from the dielectric 5 formed in the groove 10.

The transmission line of the third embodiment includes the first embodiment except that different dielectric materials 5 and 5' are disposed in the grooves 10 and 10a, respectively, as the burying dielectric 5, and the conductor lines 3 are formed on both of them.

A method of fabrication will be described.

FIGS. 8(a)–8(e) are cross-sectional views describing a method of fabricating the transmission line having high isolation according to the third embodiment. In FIGS. 8(a)–8(e), reference numeral 20 designates a protective film.

Figure 8:
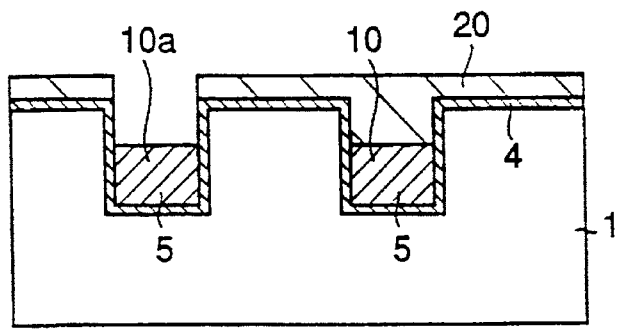
FIGS. 8(a)–8(e) are flow diagrams describing a method of fabricating the transmission lines having high isolation according to the third embodiment of the present invention.
Figure 8:
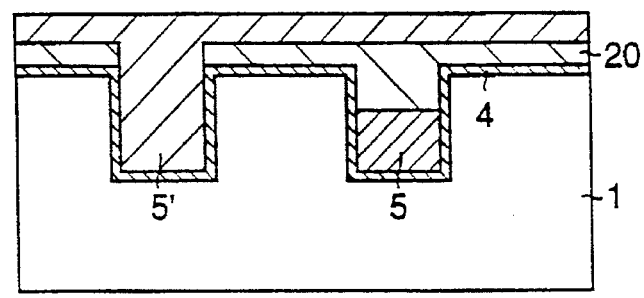
Figure 8:
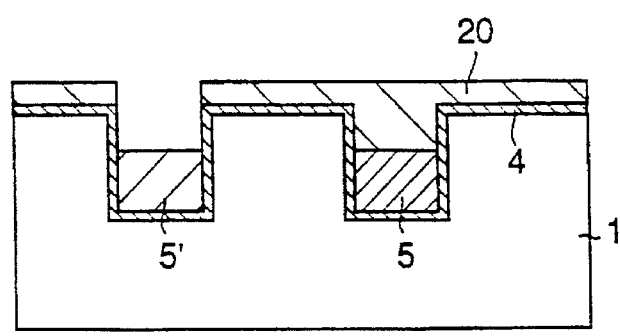
Figure 8:
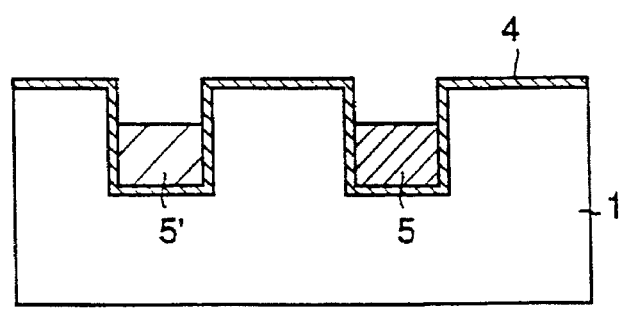
Figure 8:
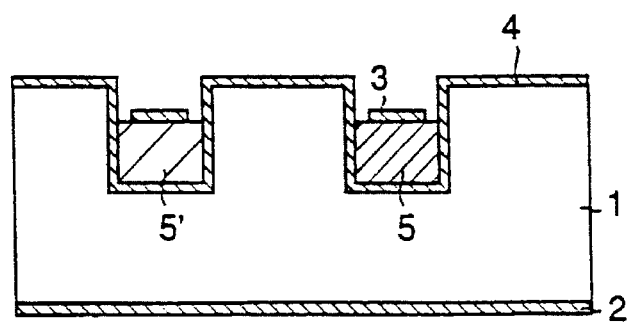

First, starting with the step shown in FIG. 4(d) of the first embodiment, the protective film 20 is formed of a material such as resist so as to cover the entire surface except a region of the groove 10a as shown in FIG. 8(a). Then, as shown in FIG. 8(b), the burying dielectric 5 in the groove 10a is etched and removed and, then, the dielectric 5' which differs from the dielectric 5 is formed on the entire surface. Next, as shown in FIG. 8(c), using appropriate etching technique, the dielectric 5' which differs from the dielectric 5 is etched until it becomes a prescribed thickness. Next, the protective film 20 is removed (FIG. 8(d)). The removal of the protective film 20 is carried out preferably by immersing it in resist removal solution. Finally, the conductor line 3 and the grounded conductor 2 are formed, thereby obtaining the transmission line of the third embodiment (FIG. 8(e)).

In the transmission line of the third embodiment having high isolation, the transmission lines having the same shape and size but different line characteristics can easily be arranged on a single substrate with high density.

Embodiment 4

Figure 9:
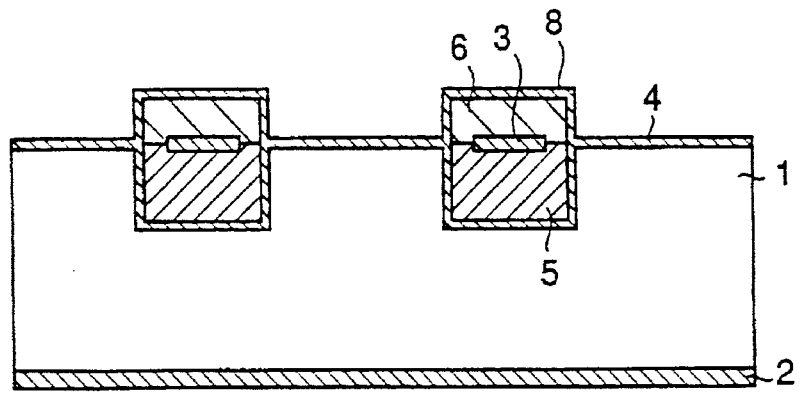
FIG. 9 is a cross-sectional view illustrating transmission line having high isolation according to a fourth embodiment of the present invention.

FIG. 9 is a cross-sectional view illustrating transmission lines having high isolation according to a fourth embodiment of the present invention. In FIG. 9, reference numeral 6 designates a second dielectric and reference numeral 8 designates a second metallization film.

The transmission line of the fourth embodiment includes the first embodiment and the second dielectric 6 formed on the first dielectric 5 and the conductor line 3, and the second metallization film 8 formed on the upper and the lateral surfaces of the dielectric 6, the second metallization film 8 being connected to the first metallization film 4.

A method of fabrication will be described.

Figure 10:
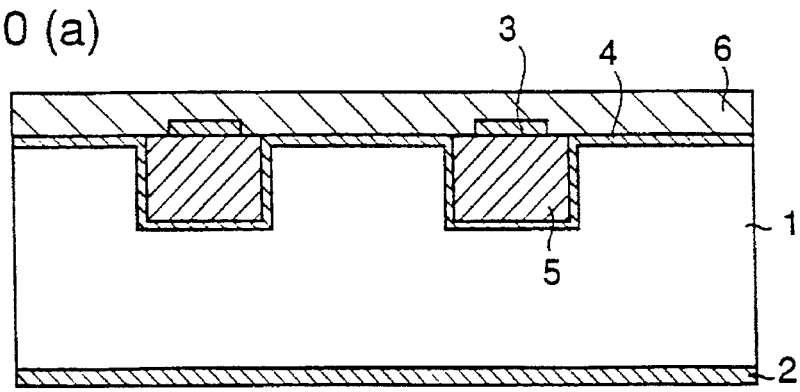
FIGS. 10(a)–10(c) are flow diagrams describing a method of fabricating the transmission lines having high isolation according to the fourth embodiment of the present invention.
Figure 10:
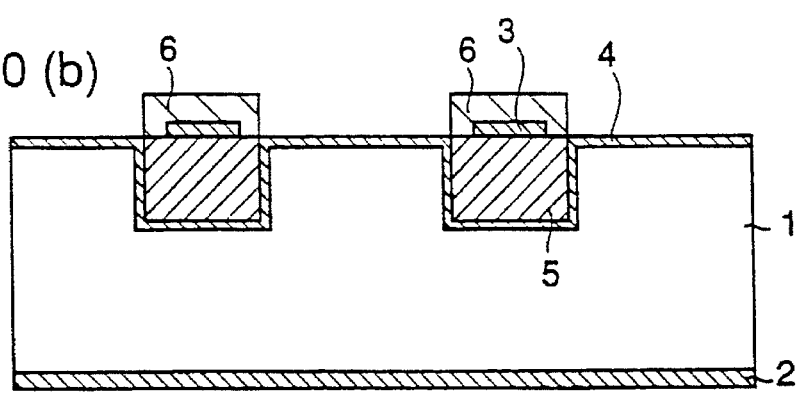
Figure 10:
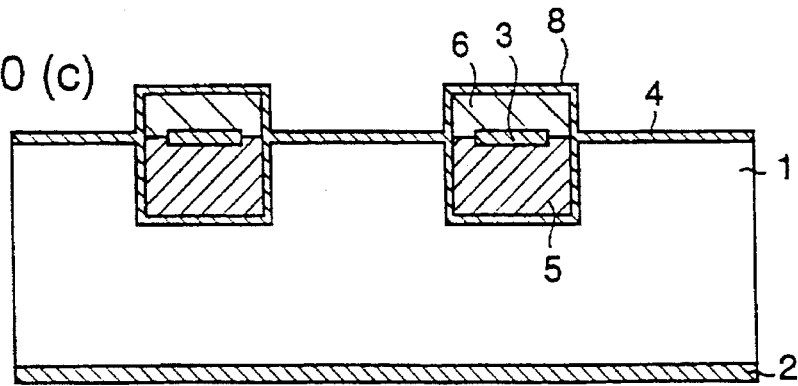

FIGS. 10(a)-10(c) are cross-sectional views describing a method of fabricating the transmission line of the fourth embodiment having high isolation.

First, starting with the transmission line of the first embodiment, the second dielectric 6 is deposited on the entire surface by CVD as shown in FIG. 10(a). Then, after masking the portion of the second dielectric 6 deposited on the groove, the rest of the second dielectric 6 is removed by RIE (FIG. 10(b)). Next, the second metallization film 8 is formed on the upper and the lateral surfaces of the second dielectric 6 preferably by sputtering (FIG. 10(c)).

In the transmission line of the fourth embodiment having high isolation, the conductor line 3 is sealed by forming the second metallization film 8, and therefore, the transmission line has an excellent confinement of an electromagnetic field. It prevents a leakage not only in the transverse direction but also in the longitudinal direction, considerably improving the transmission efficiency of the transmission line.

Embodiment 5

Figure 11:
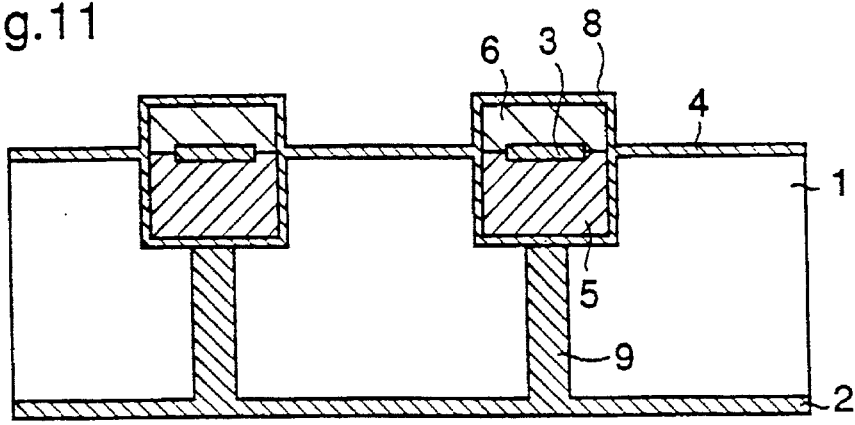
FIG. 11 is a cross-sectional view illustrating transmission lines having high isolation according to a fifth embodiment of the present invention.

FIG. 11 is a cross-sectional view illustrating a structure of transmission lines having high isolation according to a fifth embodiment of the present invention.

The transmission line of the fifth embodiment includes the second embodiment further including a second dielectric 6 formed on and making contact with the burying dielectric 5 and the conductor line 3, and a second metallization film 8 formed on the upper part and the lateral surfaces of the second dielectric 6, the second metallization film 8 being connected to the first metallization film 4. This prevents leakage of an electromagnetic field both in the transverse direction and the longitudinal direction and considerably improves the transmission efficiency of the transmission line.

Embodiment 6

Figure 12:
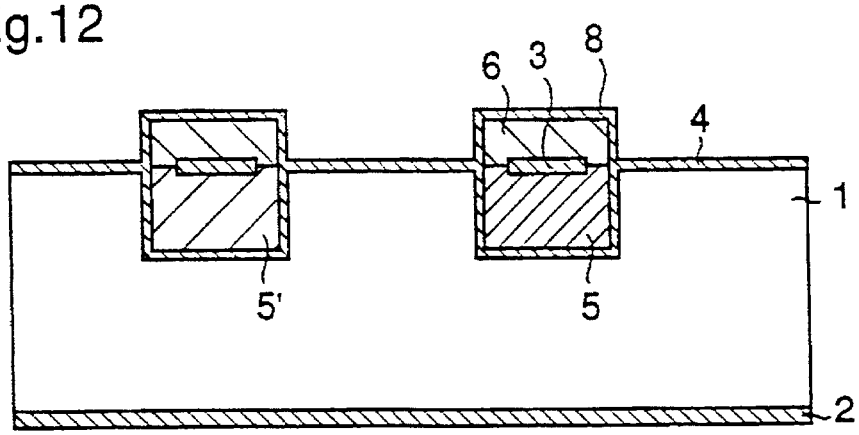
FIG. 12 is a cross-sectional view illustrating transmission lines having high isolation according to a sixth embodiment of the present invention.

FIG. 12 is a cross-sectional view illustrating a structure of transmission lines having high isolation according to a sixth embodiment of the present invention.

The transmission line of the sixth embodiment includes the third embodiment further including a second dielectric 6 formed on the first burying dielectric 5, the dielectric 5' which comprises a material different from the material constituting the dielectric 5, and the transmission lines S, and a second metallization film 8 formed on the upper surface and the lateral surfaces of the second dielectric 6, the second metallization film 8 being connected to the first metallization film 4 previously formed. Since the transmission lines are sealed by these metallization films, leakage of an electromagnetic field both in the transverse direction and the longitudinal direction is prevented, and this considerably improves the transmission efficiency of the transmission line.

Embodiment 7

Figure 13:
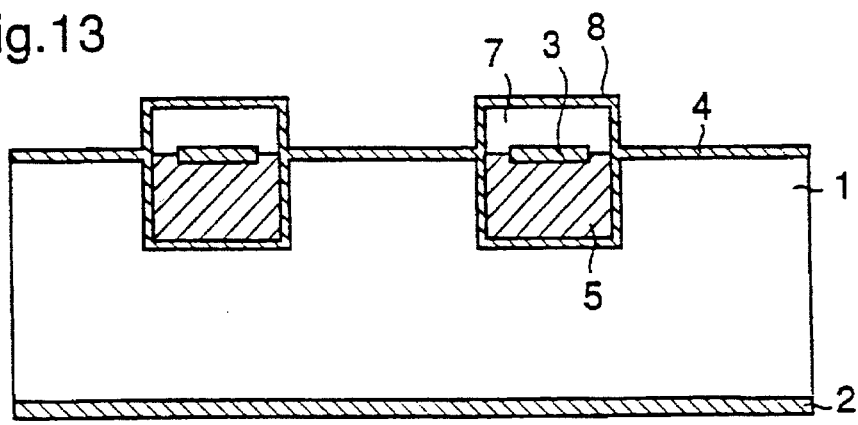
FIG. 13 is a cross-sectional view illustrating transmission lines having high isolation according to a seventh embodiment of the present invention.

FIG. 13 is a cross-sectional view illustrating a structure of transmission lines having high isolation according to a seventh embodiment of the present invention. In FIG. 13, reference numeral 7 designates an air layer.

The transmission line of the seventh embodiment is the same as the fourth embodiment except that the second dielectric 6 is replaced with the air layer 7 by selectively removing the second dielectric 6 by immersing it in an etchant which dissolves only the second dielectric 6.

In the high isolation transmission line of the seventh embodiment, since the dielectric constant of the air layer 7 is smaller than that of the second dielectric 6, the attenuation of an electromagnetic wave transmitted through the conductor line 3 can be decreased compared to the transmission line of the fourth embodiment.

Embodiment 8

Figure 14:
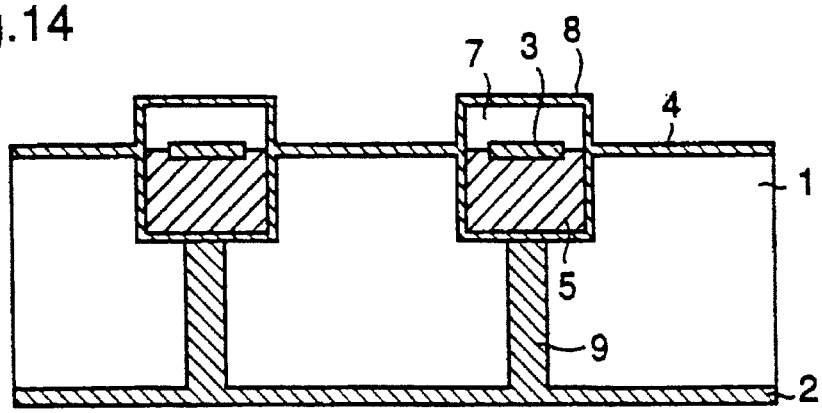
FIG. 14 is a cross-sectional view illustrating transmission lines having high isolation according to an eighth embodiment of the present invention.

FIG. 14 is a cross-sectional view illustrating a structure of transmission lines having high isolation according to an eighth embodiment of the present invention.

The transmission line of the eighth embodiment is the same as the fifth embodiment except that the second dielectric 6 is replaced with the air layer 7 by selectively removing the second dielectric 6 by immersing it in an etchant which dissolves only the second dielectric 6.

In the high isolation transmission line of the eighth embodiment, since the dielectric constant of the air layer 7 is smaller than that of the second dielectric 6, the attenuation of an electromagnetic wave transmitted through the conductor line 3 can be decreased compared to the transmission line of the fifth embodiment.

Embodiment 9

Figure 15:
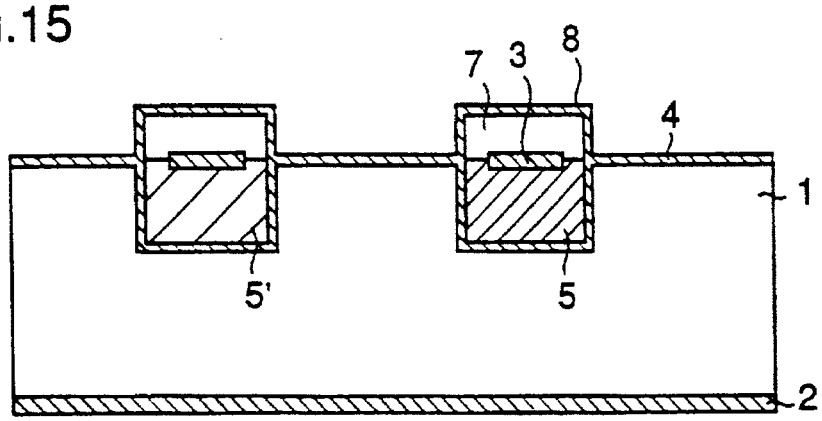
FIG. 15 is a cross-sectional view illustrating transmission lines having high isolation according to a ninth embodiment of the present invention.

FIG. 15 is a cross-sectional view illustrating a structure of transmission lines having high isolation according to a ninth embodiment of the present invention.

The transmission line of the ninth embodiment is the same as the sixth embodiment except that the second dielectric 6 is replaced with the air layer 7 by selectively removing the second dielectric 6 by immersing it in an etchant which dissolves only the second dielectric 6.

In the high isolation transmission line of the ninth embodiment, since the dielectric constant of the air layer 7 is smaller than that of the second dielectric 6, the attenuation of an electromagnetic wave transmitted through the conductor line 3 can be decreased compared to the transmission line of the sixth embodiment.

Embodiment 10

Figure 16:
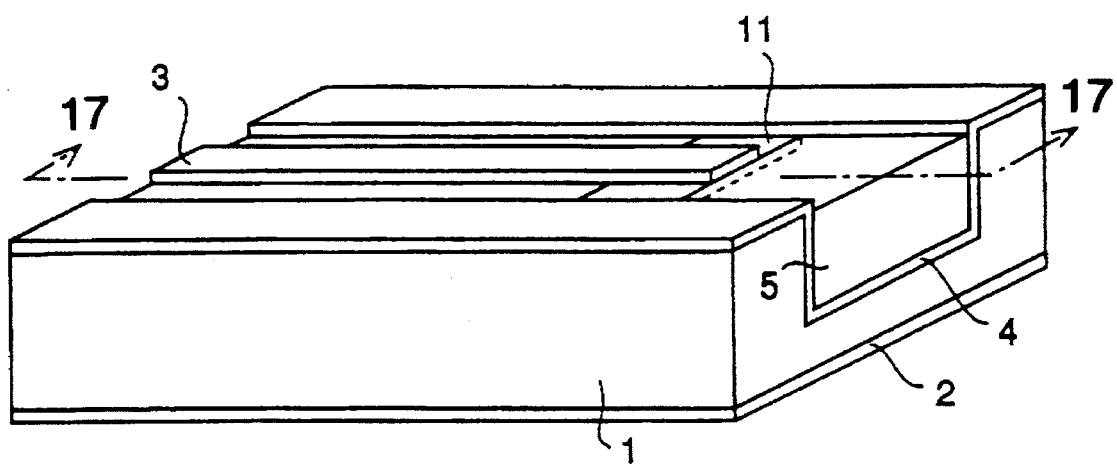
FIG. 16 is a perspective view illustrating a transmission line having high isolation according to a tenth embodiment of the present invention.

FIG. 16 is a perspective view illustrating a structure of a transmission line having high isolation according to a tenth embodiment of the present invention. In FIG. 16, reference numeral 11 designates a dielectric having a resistive component.

The transmission line of the tenth embodiment having high isolation includes the first embodiment, in which a portion of the upper part of the burying dielectric 5 filling the groove at an end of the transmission line is replaced with the dielectric 11 having a resistive component.

A method of fabrication will be described.

Figure 17:
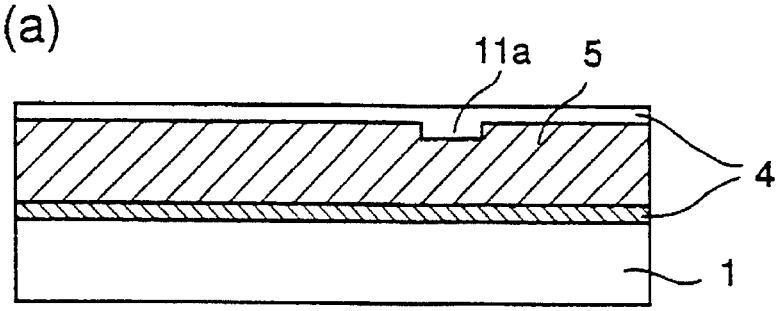
FIG. 17(a)–17(c) are flow diagrams describing a method of fabricating the transmission line having high isolation according to the tenth embodiment of the present invention.
Figure 17:
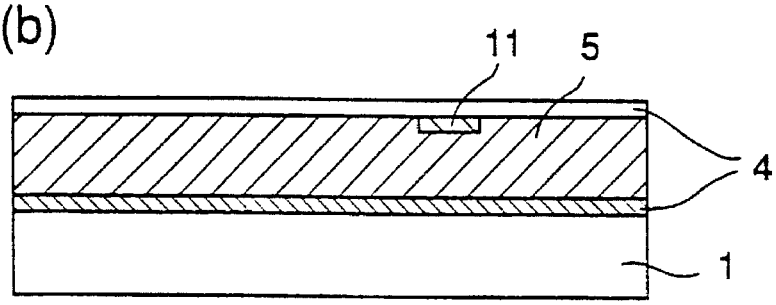
Figure 17:
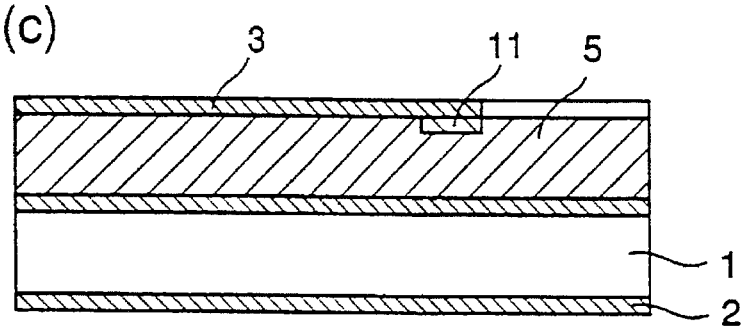

FIGS. 17(a)-17(c) are cross-sectional views describing a method of fabricating a transmission line having high isolation according to the tenth embodiment, taken along the line 17—17 in FIG. 16. In the figures, reference numeral 11a designates the location of the end of the transmission line.

First, as shown in FIG. 17(a), starting with the step shown in FIG. 4(d), a region of the surface of the first burying dielectric except the end region 11a of the transmission line is masked, and then the portion of the burying dielectric 5 at the end region 11a of the transmission line is removed by RIE. Next, as shown in FIG. 17(b), the dielectric 11 (NiCr, WSiN, or dielectric mixed with metal powder) having a resistive component is deposited at the end region 11a of the transmission line by CVD. Finally, the conductor line 3 and the grounded conductor 2 are formed (FIG. 17(c)).

In the transmission line of the tenth embodiment having high isolation, by matching the resistance of the dielectric 11 which has a resistive component to the characteristic impedance of the transmission line, a transmission line having a termination resistor for an ultra high frequency wave transmission line can be obtained.

Embodiment 11

Figure 18:
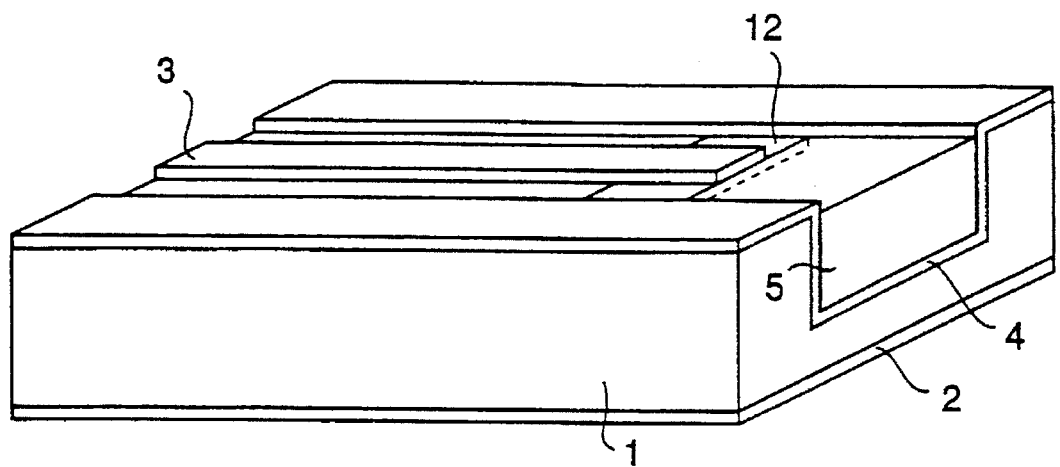
FIG. 18 is a perspective view illustrating a transmission line having high isolation according to an eleventh embodiment of the present invention.

FIG. 18 is a perspective view illustrating a structure of a transmission line having high isolation according to an eleventh embodiment of the present invention. In FIG. 18, reference numeral 12 designates a good conductor.

The transmission line of the eleventh embodiment having high isolation includes the first embodiment, in which a portion of the upper part of the burying dielectric 5 filling the groove at an end of the transmission line is replaced with the good conductor 12. It is produced by a similar method as in the tenth embodiment, in which a portion of the burying dielectric 5 at the end region 11a of the transmission line is removed and, then, the good conductor 12 (for example, Au, Cu) is disposed in the end region 11a of the transmission line by evaporation and lift-off, and finally the conductor line 3 and the grounded conductor 2 are formed.

In the transmission line of the eleventh embodiment having high isolation, since the transmission line 3 and the first metallization film 4 are electrically short-circuited by the good conductor 12, a transmission line constituting a shorted stub for an ultra high frequency wave transmission line can be obtained.

Embodiment 12

Figure 19:
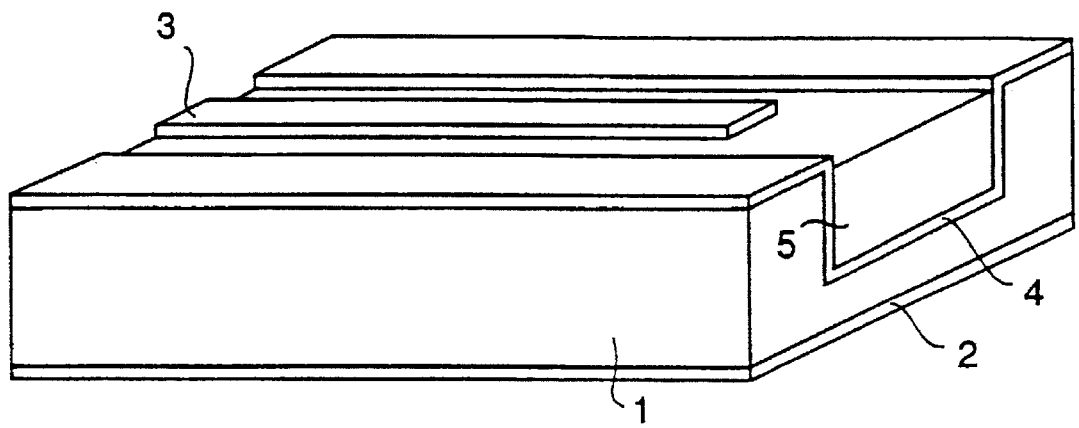
FIG. 19 is a perspective view illustrating a transmission line having high isolation according to a twelfth embodiment of the present invention.

FIG. 19 is a perspective view illustrating a structure of a transmission line having high isolation according to a twelfth embodiment of the present invention.

The transmission line of the twelfth embodiment having high isolation includes the first embodiment, in which the length of the transmission line 3 is less than both the burying dielectric 5 and the first metallization film 4 which are disposed under the transmission line 3. Because of this structure, a transmission line constituting an open stub for a high frequency wave transmission line can be obtained.

Embodiment 13

Figure 20:
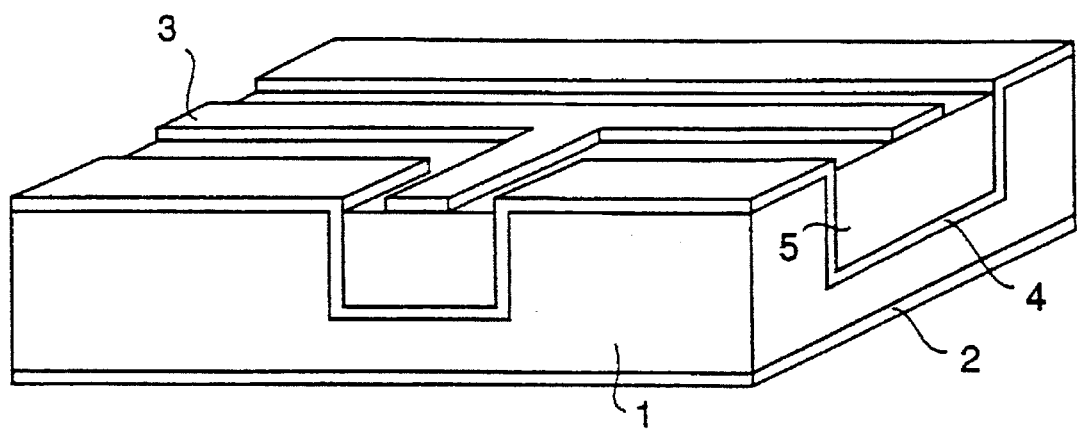
FIG. 20 is a perspective view illustrating a transmission line having high isolation according to a thirteenth embodiment of the present invention.

FIG. 20 is a perspective view illustrating a structure of a transmission line having high isolation according to a thirteenth embodiment of the present invention.

In the thirteenth embodiment, the transmission line described in the first embodiment branches into a T-shape.

The transmission line of the thirteenth embodiment can easily be fabricated by modifying the method of fabricating the first embodiment as follows. When the groove is formed by wet etching or RIE, the opening of the mask is made T-shaped. When mechanical fabrication with a dicing saw and the like is employed, the groove is ground into a T-shape, and when the conductor line 3 is formed by evaporation and lift-off, the mask is made into a T-shape.

In the thirteenth embodiment, since the transmission line branches into a T-shape, a transmission line constituting a T-shaped branch circuit can be obtained.

Embodiment 14

Figure 21:
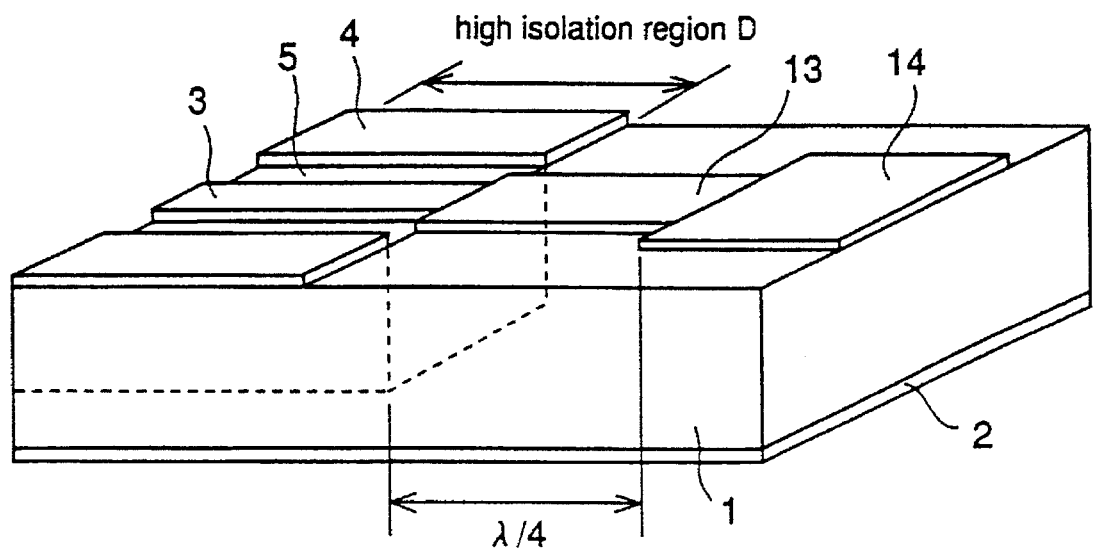
FIG. 21 is a perspective view illustrating a transmission line having high isolation according to a fourteenth embodiment of the present invention.

FIG. 21 is a perspective view illustrating a structure of a transmission line having high isolation according to a fourteenth embodiment of the present invention. In FIG. 21, reference numeral 13 designates a connecting microstrip line and reference numeral 14 designates a regular microstrip line.

The transmission line of the fourteenth embodiment having high isolation has a structure connecting the transmission line described in the first embodiment and the regular microstrip line 14. They are connected by the connecting microstrip line 13 of a length of (¼)λ and having the characteristic impedance of $Z_c=[(Z_{o1})(Z_{o2})]^{1/2}$, where $Z_{o1}$ represents the characteristic impedance of the high isolation transmission line and $Z_{o2}$ the characteristic impedance of the microstrip line to be connected.

In the fourteenth embodiment, using a similar method as in the first embodiment, the groove is formed in the high isolation region D of the substrate 1, and the first metallization film 4 is formed on the inside of the groove and the front surface of the substrate 1, and then, the burying dielectric 5 is buried in the groove. Finally, the conductor line 3, the connecting microstrip line 13, and the regular microstrip line 14 are simultaneously formed by evaporation and lift-off, forming the transmission line.

In the fourteenth embodiment, a transmission line constituting a line impedance matching circuit can be obtained.

Embodiment 15

Figure 22:
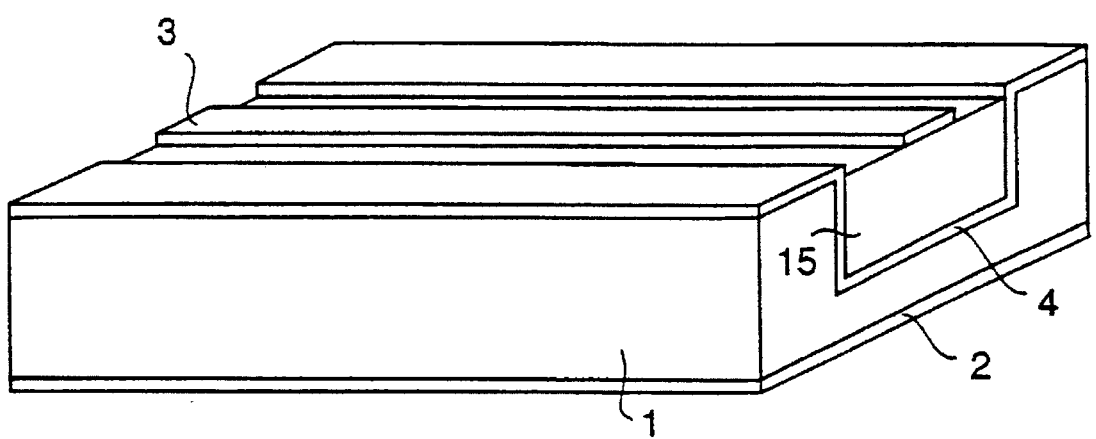
FIG. 22 is a perspective view illustrating a transmission line having high isolation according to a fifteenth embodiment of the present invention.

FIG. 22 is a perspective view illustrating a structure of a transmission line having high isolation according to a fifteenth embodiment of the present invention. In FIG. 22, reference numeral 15 designates dielectric having homogeneous conductivity.

The transmission line of the fifteenth embodiment having high isolation is the same as the first embodiment except that the burying dielectric 5 in the groove is replaced with the dielectric 15 having homogeneous conductivity, and this can easily be formed by using NiCr, WSiN, or dielectric mixed with metal powder.

In the fifteenth embodiment, a transmission line constituting a transmission line type attenuator for an ultra high frequency wave whose line has a loss can be obtained.

Embodiment 16

Figure 23:
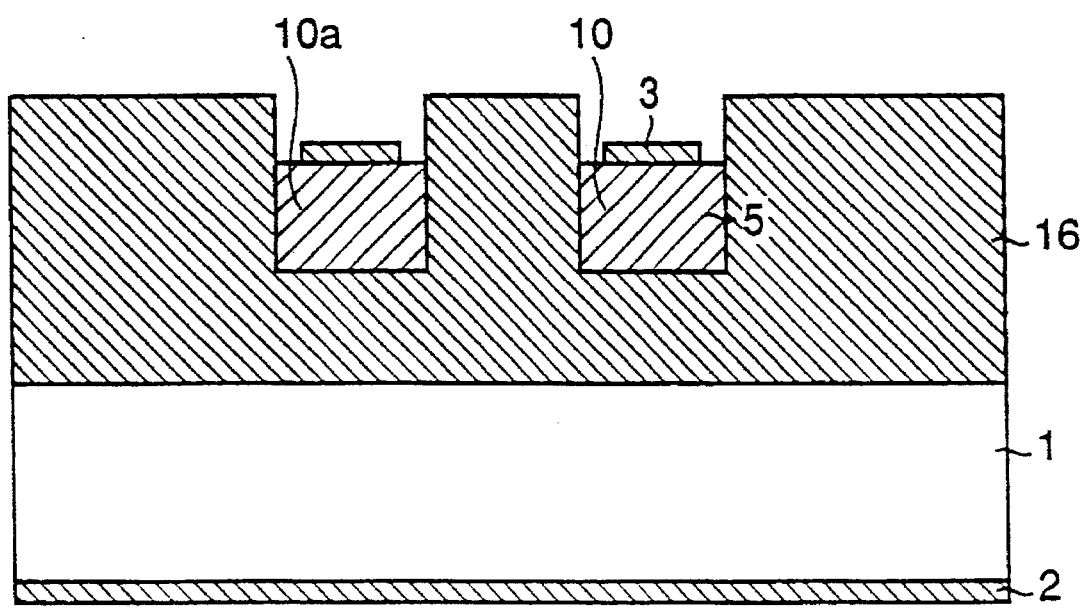
FIG. 23 is a cross-sectional view illustrating transmission lines having high isolation according to a sixteenth embodiment of the present invention.

FIG. 23 is a cross-sectional view illustrating transmission lines having high isolation according to a sixteenth embodiment of the present invention. In FIG. 23, reference numeral 16 designates a metallization layer formed on the front surface of the substrate 1.

In the sixteenth embodiment, the grooves 10 and 10a are is the metallization layer 16 which is formed on the front surface of the substrate 1. Then, the burying dielectric 5 is buried in the grooves 10 and 10a, and the conductor lines 3 are disposed on the surface of the burying dielectric 5.

A method of fabrication will be described.

FIGS. 24(a)–24(d) are cross-sectional views describing a method of fabricating the transmission lines of the sixteenth embodiment having high isolation.

Figure 24:
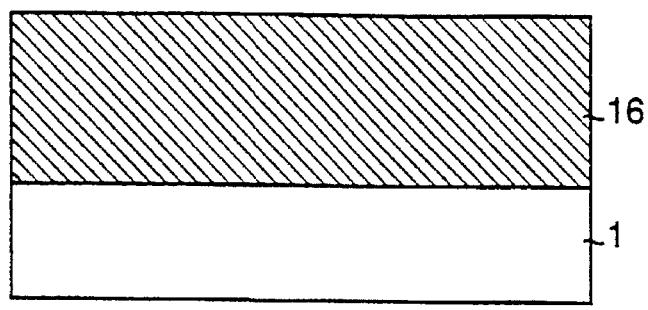
FIGS. 24(a)–24(d) are flow diagrams describing a method of fabricating the transmission lines having high isolation according to the sixteenth embodiment of the present invention.
Figure 24:
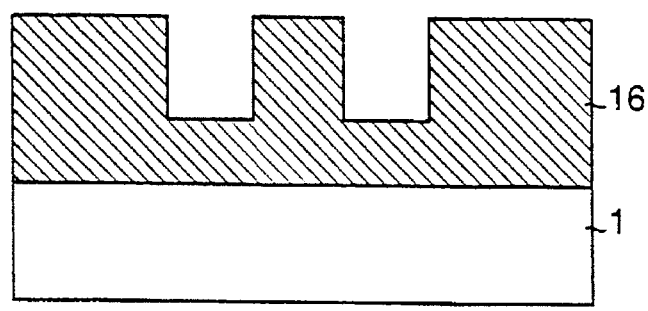
Figure 24:
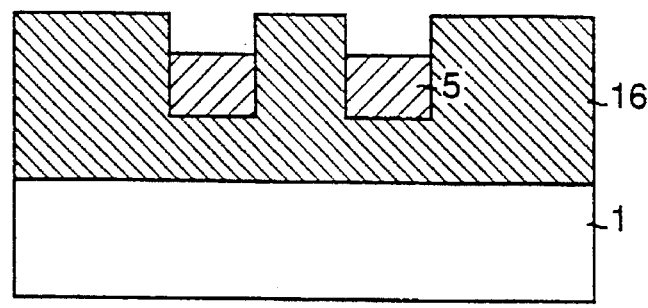
Figure 24:
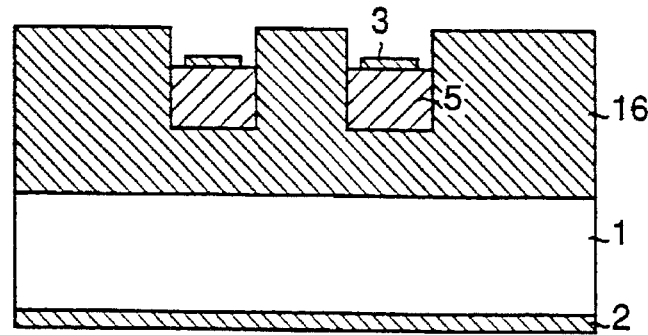

First, as shown in FIG. 24(a), the metallization layer 16 (Cu/W alloy, and the like) is adhered to the semiconductor substrate (GaSi, Si, and the like) or the dielectric substrate 1 (ceramics and the like) preferably using a Si based adhesive agent. Next, as shown in FIG. 24(b), the groove is formed on the surface of the metallization layer 16 by iodine based etching or ion milling or, if the width of the groove is large, mechanically using a dicing saw or the like. Next, the burying dielectric 5 is deposited by a similar method as in the first embodiment (FIG. 24(c)), and finally, a metallization film which becomes the conductor line 3 and another metallization film which becomes the grounded conductor 2 are formed, thereby producing the transmission line of the sixteenth embodiment (FIG. 24(d)).

As is apparent from the FIG. 23, in the transmission line of the sixteenth embodiment having high isolation, a similar effect as in the first embodiment can be obtained.

Embodiment 17

Figure 25:
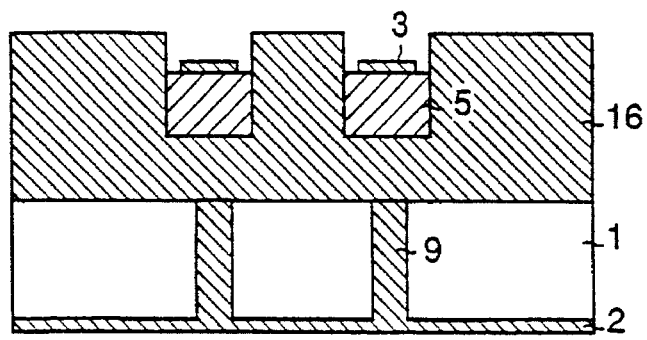
FIG. 25 is a cross-sectional view illustrating transmission lines having high isolation according to a seventeenth embodiment of the present invention.

FIG. 25 is a cross-sectional view illustrating a structure of transmission lines having high isolation according to a seventeenth embodiment of the present invention.

The transmission line of the seventeenth embodiment includes the sixteenth embodiment, and the via hole 9 which electrically connects the bottom of the metallization layer 16 adhered to the front surface of the substrate 1 and the grounded conductor 2 formed on the rear surface of the substrate 1.

A method of fabrication will be described.

Figure 26:
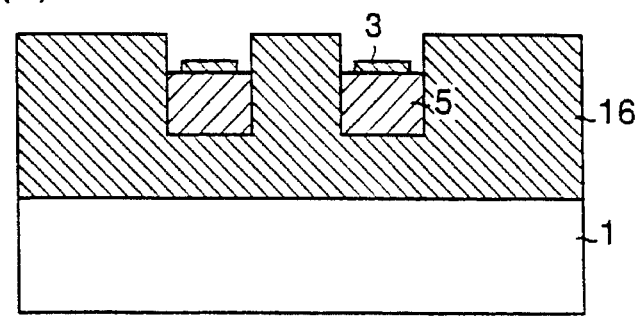
FIGS. 26(a)–26(c) are flow diagrams describing a method of fabricating the transmission lines having high isolation according to the seventeenth embodiment of the present invention.
Figure 26:
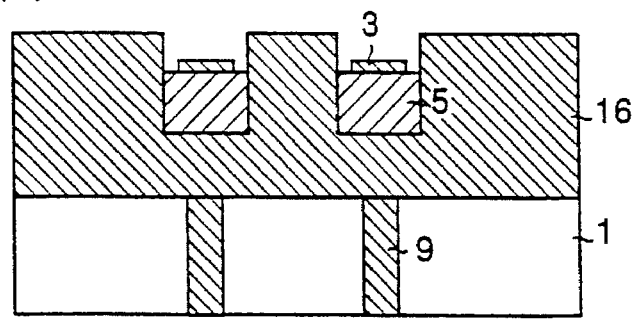
Figure 26:
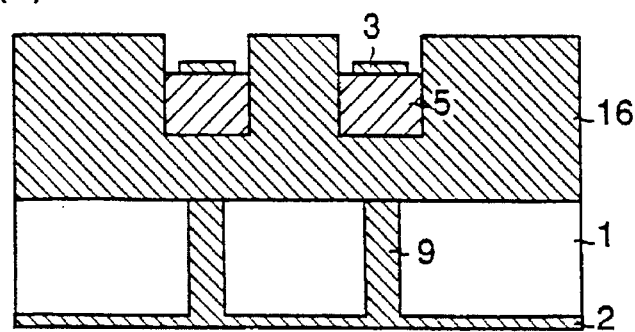

FIGS. 26(a)–26(c) are cross-sectional views describing a method of fabricating the transmission lines having high isolation according to the seventeenth embodiment.

First, starting with the step shown in FIG. 24(c), a metallization film which becomes the conductor line 3 is formed on the burying dielectric 5 (FIG. 26(a)) and, then, the via hole 9 of a diameter of 50 μm or greater is formed from the rear surface of the substrate toward the bottom of the metallization layer 16, reaching the bottom of the metallization layer 16 (FIG. 26(b)). This is an effective method when the substrate 1 comprises a semiconductor material and it can easily be formed using a wet or dry etching technique. Finally, as shown in FIG. 26(c), the inside of the via hole 9 and the rear surface of the substrate are metallized using methods such as sputtering or plating from the rear surface.

In the transmission line of the seventeenth embodiment having high isolation, since the metallization layer 16 and the grounded conductor 2 on the rear surface of the substrate are connected, an ideal ground characteristic can be obtained, and more stable transmission can be achieved.

Embodiment 18

Figure 27:
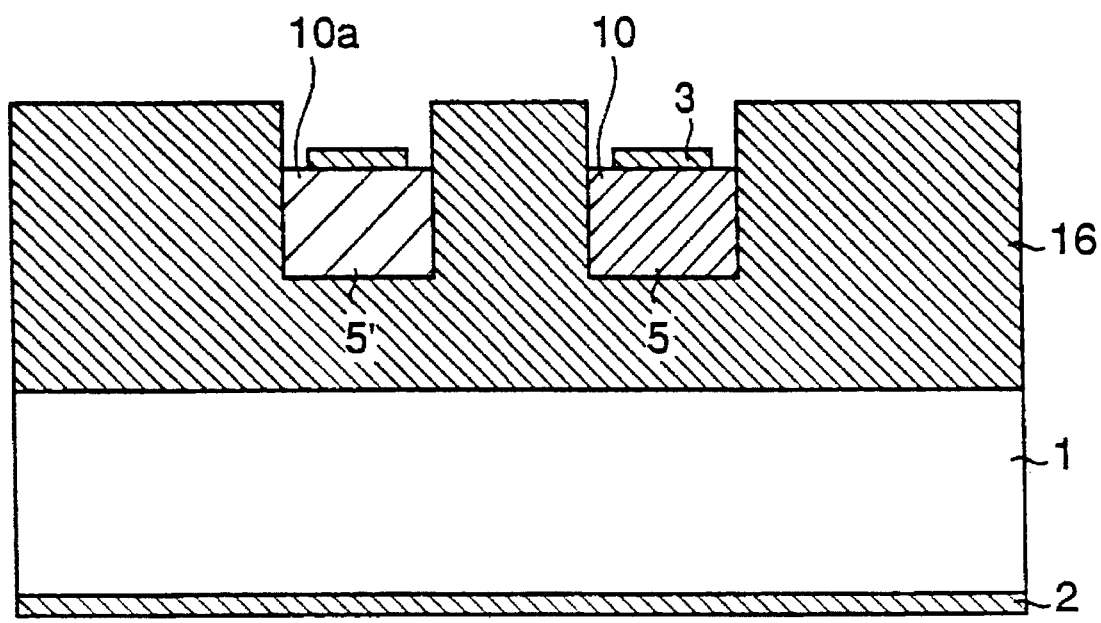
FIG. 27 is a cross-sectional view illustrating transmission lines having high isolation according to an eighteenth embodiment of the present invention.

FIG. 27 is a cross-sectional view illustrating a structure of transmission lines having high isolation according to an eighteenth embodiment of the present invention.

The transmission line of the eighteenth embodiment is the same as the sixteenth embodiment except that different dielectric materials 5 and 5' are disposed in the grooves 10 and 10a as the burying dielectric and the conductor lines 3 are formed on them.

A method of fabrication will be described.

FIGS. 28(a)–28(e) are cross-sectional views describing a method of fabricating the transmission line having high isolation according to the eighteenth embodiment.

Figure 28:
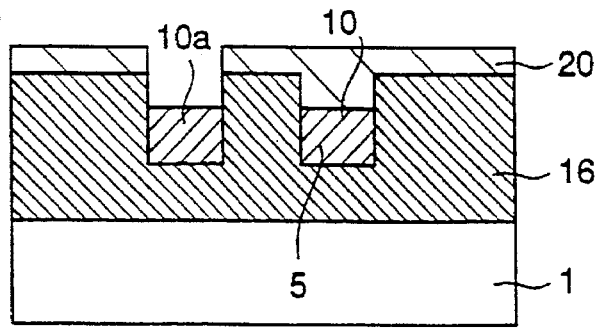
FIGS. 28(a)–28(e) are flow diagrams describing a method of fabricating the transmission lines having high isolation according to the eighteenth embodiment of the present invention.
Figure 28:
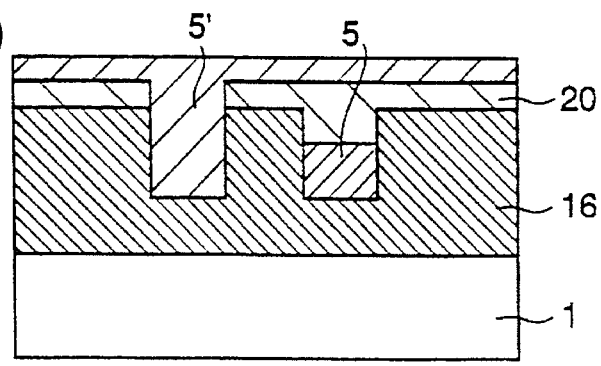
Figure 28:
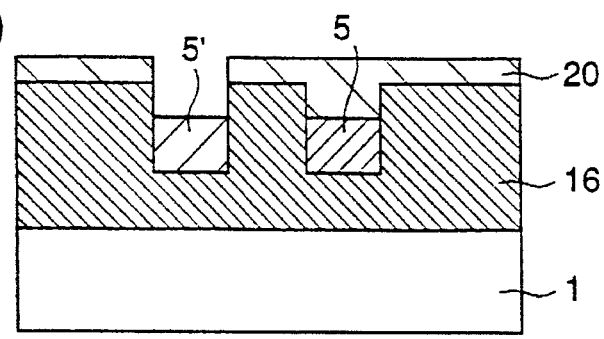
Figure 28:
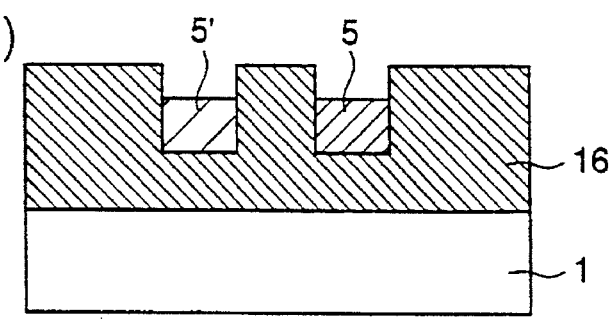
Figure 28:
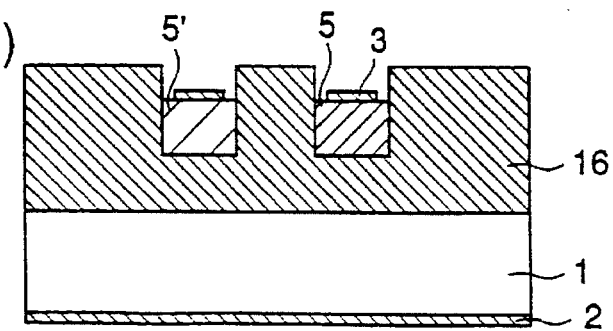

First, starting with the step shown in FIG. 24(c), the protective film 20 comprising a material such as a resist is formed so as to cover the entire surface except the region of the groove 10a as shown in FIG. 28(a). Then, as shown in FIG. 28(b), the burying dielectric 5 in the groove 10a is etched away and, then, a different dielectric 5' is formed on the entire surface. Next, as shown in FIG. 28(c), the different dielectric 5' is etched until it becomes a prescribed thickness using an appropriate etching technique. Next, the protective film 20 is removed (FIG. 28(d)). The removal of the protective film 20 is carried out preferably by immersing it in a resist removal solution. Finally, the conductor line 3 and the grounded conductor 2 are formed, thereby producing the transmission line of the eighteenth embodiment (FIG. 28(e)).

In the transmission line of the eighteenth embodiment having high isolation, transmission lines of the same shape and the same size having different line characteristics can easily be arranged in a high density on a single substrate.

Embodiment 19

Figure 29:
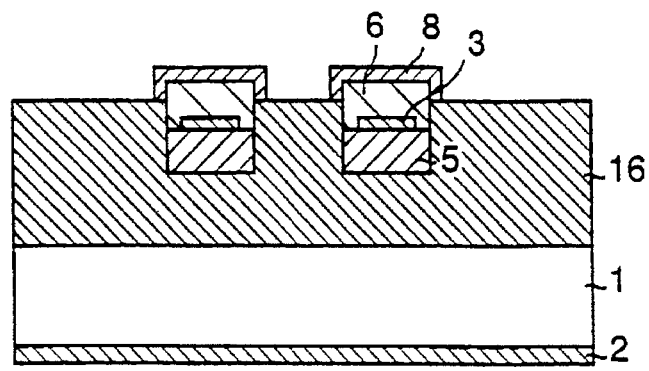
FIG. 29 is a cross-sectional view illustrating transmission lines having high isolation according to a nineteenth embodiment of the present invention.

FIG. 29 is a cross-sectional view illustrating a structure of transmission lines having high isolation according to a nineteenth embodiment of the present invention.

The structure of the transmission line of the nineteenth embodiment includes the sixteenth embodiment, and the second dielectric 6 formed on the first dielectric 5 and the conductor line 3, and the second metallization film 8 formed on the upper part and the lateral surfaces of the second dielectric 6, the second metallization film 8 being connected to the metallization layer 16.

A method of fabrication will be described.

Figure 30:
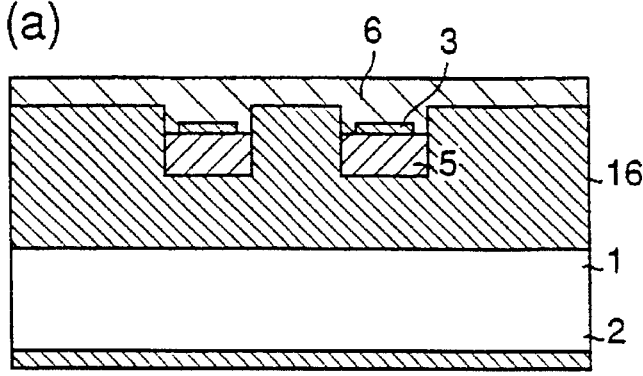
FIGS. 30(a)–30(c) are flow diagrams describing a method of fabricating the transmission lines having high isolation according to the nineteenth embodiment of the present invention.
Figure 30:
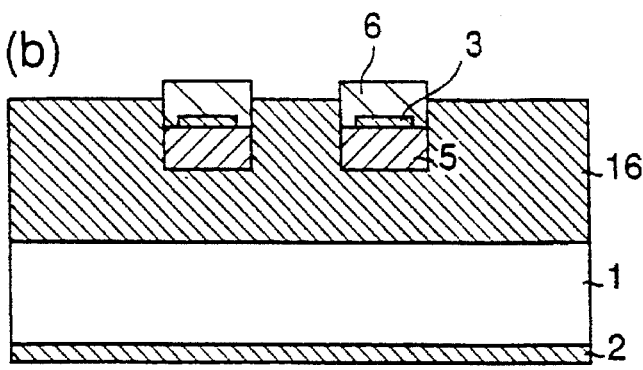
Figure 30:
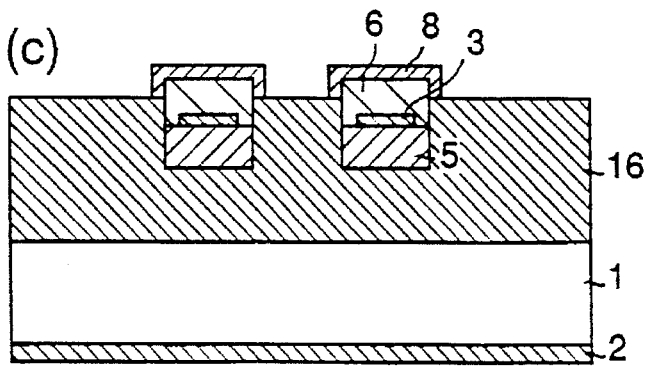

FIGS. 30(a)–30(c) are cross-sectional views describing a method of fabricating transmission lines of the nineteenth embodiment having high isolation.

First, the second dielectric 6 is deposited by CVD on the entire surface including the transmission line as described in the sixteenth embodiment, as shown in FIG. 30(a). Then, a portion of the second dielectric 6 deposited on the groove is masked and, then, the second dielectric 6 except the masked region is removed by RIE (FIG. 30(b)). Then, the second metallization film 8 is formed on the front and the lateral surfaces of the second dielectric 6, preferably by sputtering (FIG. 30(c)).

In the transmission line of the nineteenth embodiment having high isolation, the conductor line 3 is sealed by the second metallization film 8. This improves the confinement of an electromagnetic field and prevents leakage in the longitudinal direction as well as in the transverse direction, thereby considerably improving the transmission efficiency of the transmission line.

Embodiment 20

Figure 31:
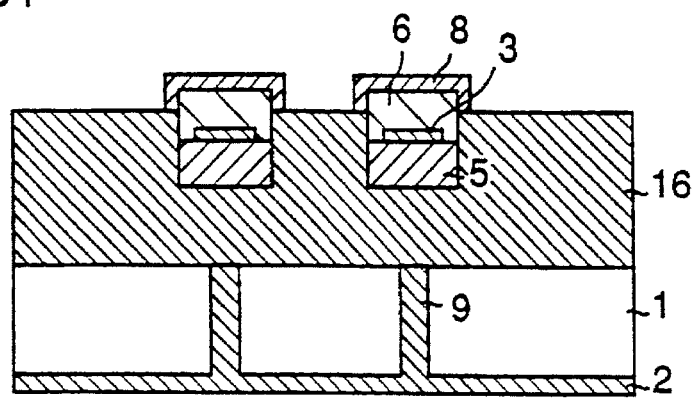
FIG. 31 is a cross-sectional view illustrating transmission lines having high isolation according to a twentieth embodiment of the present invention.

FIG. 31 is a cross-sectional view illustrating a structure of transmission lines having high isolation according to a twentieth embodiment of the present invention.

The transmission line of the twentieth embodiment having high isolation includes the seventeenth embodiment, and the second dielectric 6 formed on and making contact to the burying dielectric 5 and the conductor line 3, and the second metallization film 8 formed on and making contact to the upper part and the lateral surfaces of the second dielectric 6, the second metallization film 8 being connected to the metallization layer 16. Because of this structure, a similar effect as in the fifth embodiment can be obtained.

Embodiment 21

Figure 32:
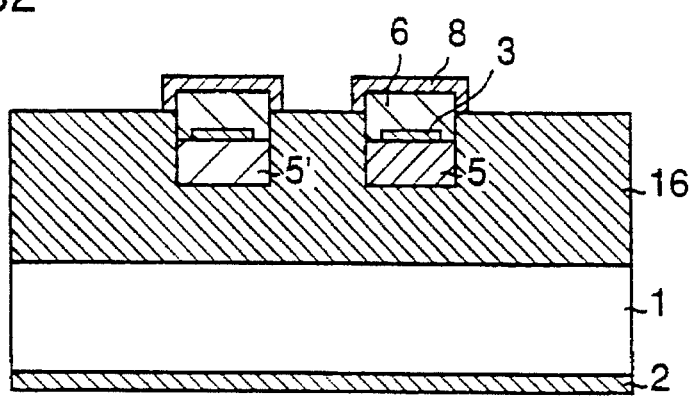
FIG. 32 is a cross-sectional view illustrating transmission lines having high isolation according to a twenty-first embodiment of the present invention.

FIG. 32 is a cross-sectional view illustrating a structure of transmission lines having high isolation according to a twenty-first embodiment of the present invention.

The transmission line of the twenty-first embodiment having high isolation includes the eighteenth embodiment and the second dielectric 6 formed on the first burying dielectric 5, the dielectric 5' comprising a material different from the first burying dielectric 5, the conductor line 3, and the second metallization film 8 formed on the upper part and the lateral surfaces of the second dielectric 6, the second metallization film 8 being connected to the previously formed metallization layer 16. Because of this structure, a the similar effect as in the sixth embodiment can be obtained.

Embodiment 22

Figure 33:
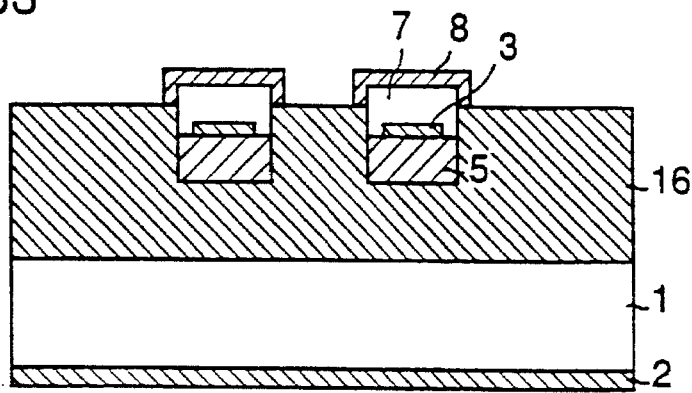
FIG. 33 is a cross-sectional view illustrating transmission lines having high isolation according to a twenty-second embodiment of the present invention.

FIG. 33 is a cross-sectional view illustrating a structure of transmission lines having high isolation according to a twenty-second embodiment of the present invention.

The transmission line of the twenty-second embodiment is the same as the nineteenth embodiment except that the second dielectric 6 is selectively removed by immersing it in an etchant which dissolves only the second dielectric 6 and is replaced with the air layer 7. As a result, a similar effect as in the seventh embodiment can be obtained.

Embodiment 23

Figure 34:
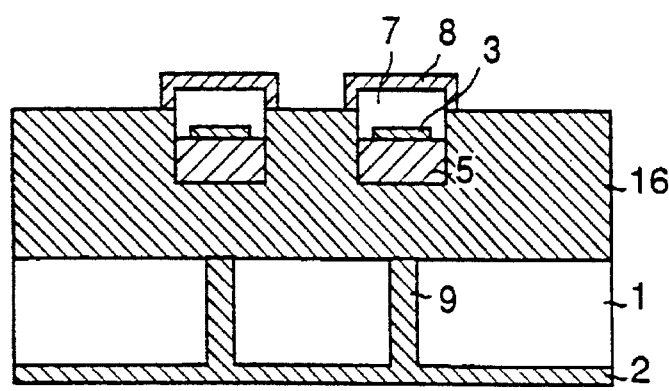
FIG. 34 is a cross-sectional view illustrating transmission lines having high isolation according to a twenty-third embodiment of the present invention.

FIG. 34 is a cross-sectional view illustrating a structure of transmission lines having high isolation according to the twenty-third embodiment of the present invention.

The transmission line of the twenty-third embodiment is the same as the twentieth embodiment except that the second dielectric 6 is selectively removed by immersing it in an etchant which dissolves only the second dielectric 6 and is replaced with the air layer 7. As a result, a similar effect as in the eighth embodiment can be obtained.

Embodiment 24

Figure 35:
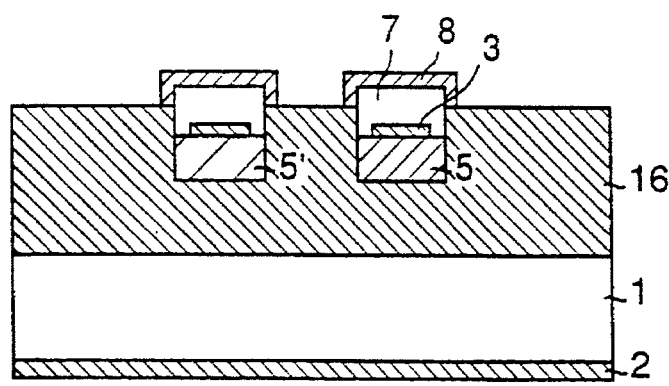
FIG. 35 is a cross-sectional view illustrating transmission lines having high isolation according to a twenty-fourth embodiment of the present invention.

FIG. 35 is a cross-sectional view illustrating a structure of transmission lines having high isolation according to a twenty-fourth embodiment of the present invention.

The transmission line of the twenty-fourth embodiment is the same as the twenty-first embodiment except that the second dielectric 6 is selectively removed by immersing it in an etchant which dissolves only the second dielectric 6 and is replaced with the air layer 7. As a result, a similar effect as in the ninth embodiment can be obtained.

Embodiment 25

Figure 36:
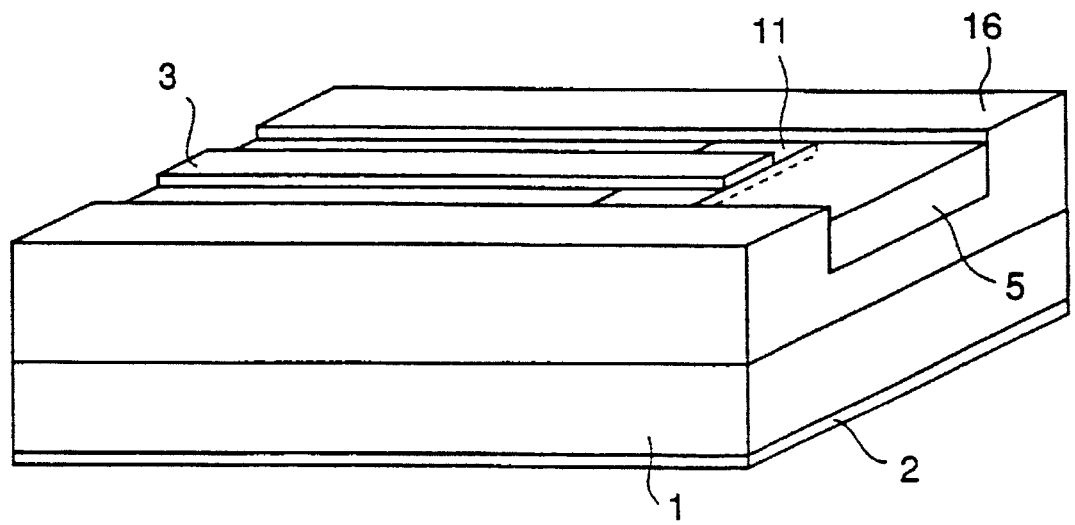
FIG. 36 is a perspective view illustrating a transmission line having high isolation according to a twenty-fifth embodiment of the present invention.

FIG. 36 is a perspective view illustrating a structure of a transmission line having high isolation according to a twenty-fifth embodiment of the present invention.

The transmission line of the twenty-fifth embodiment having high isolation includes the sixteenth embodiment, in which using the same method as in the tenth embodiment, a portion of the burying dielectric located at an end of the transmission line is replaced with the dielectric 11 (NiCr, WSiN, or dielectric mixed with metal powder) having a resistive component and the resistance of the dielectric 11 having the resistive component is matched with the characteristic impedance of the transmission line. As a result, a transmission line constituting a termination resistor for an ultra high frequency wave transmission line can be obtained.

Embodiment 26

Figure 37:
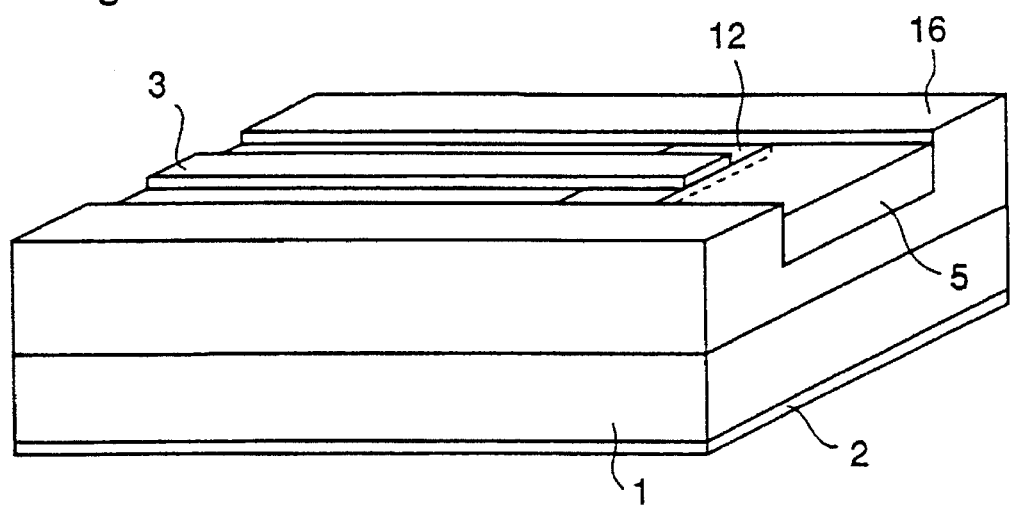
FIG. 37 is a perspective view illustrating a transmission line having high isolation according to a twenty-sixth embodiment of the present invention.

FIG. 37 is a perspective view illustrating a transmission line having high isolation according to a twenty-sixth embodiment of the present invention.

The transmission line of the twenty-sixth embodiment having high isolation includes the sixteenth embodiment, in which using the method of the eleventh embodiment, a portion of the front surface of the burying dielectric 5 buried in the groove is replaced with a good conductor 12 (Au, Cu, and the like) at an end of the transmission line, so that the transmission line 3 and the metallization layer 16 are electrically shorted. As a result, a transmission line constituting a shorted stub for an ultra high frequency wave transmission line can be obtained.

Embodiment 27

Figure 38:
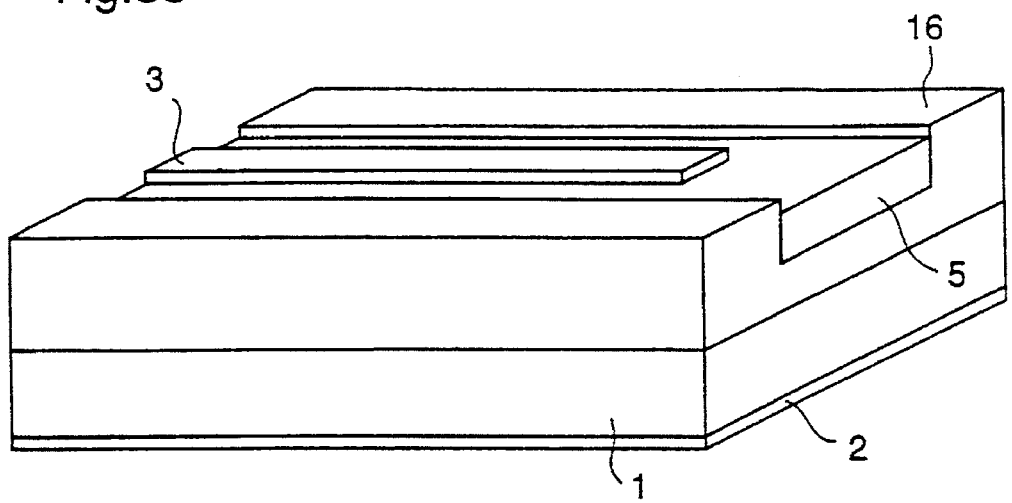
FIG. 38 is a perspective view illustrating a transmission line having high isolation according to a twenty-seventh embodiment of the present invention.

FIG. 38 is a perspective view illustrating a structure of a transmission line having high isolation according to a twenty-seventh embodiment of the present invention.

The transmission line of the twenty-seventh embodiment having high isolation includes the sixteenth embodiment in which the length of the transmission line 3 is less than those of the burying dielectric 5 and of the first metallization film 4 both of which are disposed under the transmission line 3 as in the twelfth embodiment. Because of this structure, a transmission line constituting an open stub transmission line for an ultra high frequency wave can be obtained.

Embodiment 28

Figure 39:
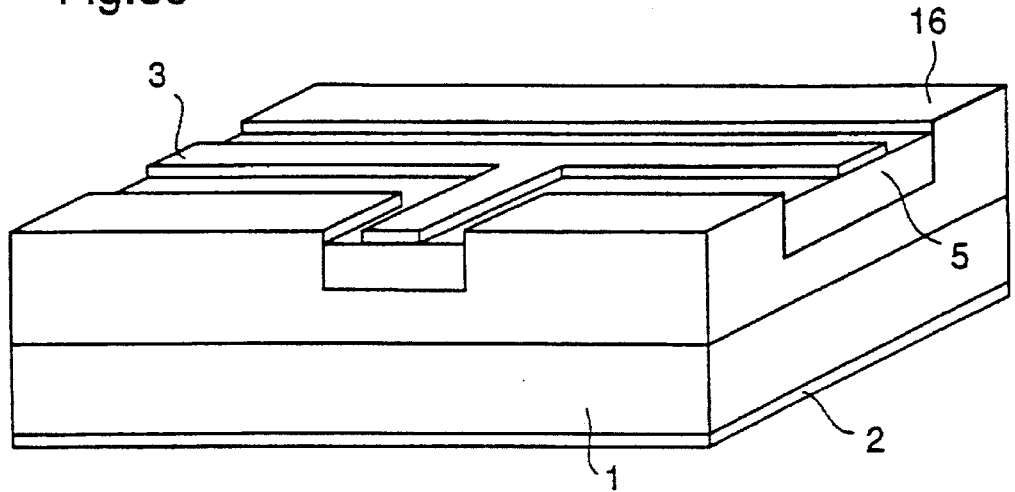
FIG. 39 is a perspective view illustrating a transmission line having high isolation according to a twenty-eighth embodiment of the present invention.

FIG. 39 is a perspective view illustrating a structure of a transmission line having high isolation according to a twenty-eighth embodiment of the present.

In the twenty-eighth embodiment, the transmission line of the sixteenth embodiment is made to branch into a T-shape by a similar method as in the thirteenth embodiment. As a result, a transmission line constituting a T-shaped branch circuit can be obtained.

Embodiment 29

Figure 40:
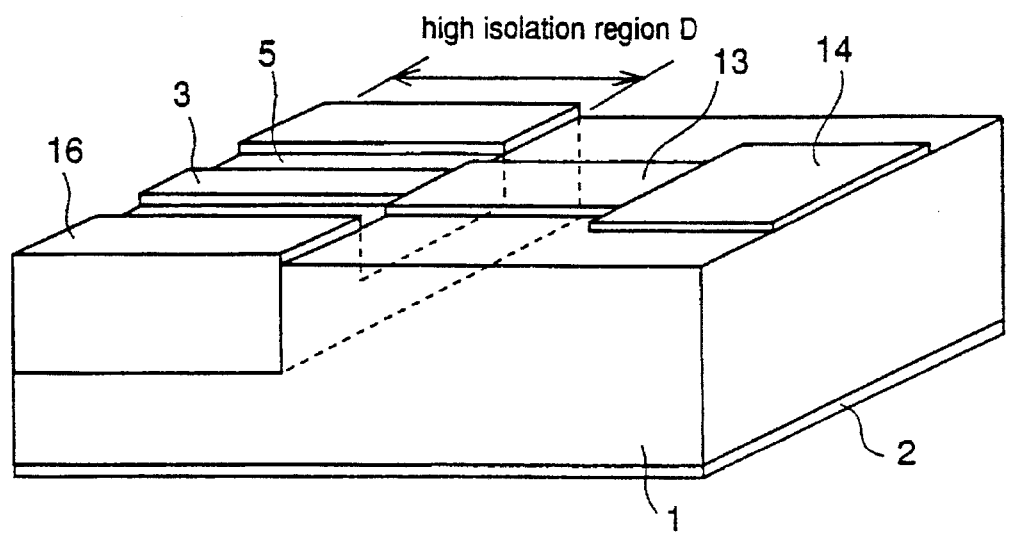
FIG. 40 is a perspective view illustrating a transmission line having high isolation according to a twenty-ninth embodiment of the present invention.

FIG. 40 is a perspective view illustrating a structure of a transmission line having high isolation according to a twenty-ninth embodiment of the present invention.

The transmission line of the twenty-ninth embodiment having high isolation has the structure connecting the transmission line described for the sixteenth embodiment and the regular microstrip line 16. They are connected by the connecting microstrip line 13 of a length of $(¼)\lambda$ and having the characteristic impedance of $Z_c=[(Z_{01})(Z_{02})]^{1/2}$, where $Z_{01}$ represents the characteristic impedance of the high isolation transmission line and $Z_{02}$ the characteristic impedance of the microstrip line to be connected.

In the twenty-ninth embodiment, the high isolation region D of the substrate 1 shown in FIG. 40 is removed by an appropriate etching technique, and the metallization layer 16 is adhered where the portion of the substrate 1 is removed. Then, within the high isolation region D, using the same method as in the sixteenth embodiment, the groove is formed and the burying dielectric 5 is buried in the groove. Finally, the conductor line 3, the connecting microstrip line 13, and the regular microstrip line 14 are simultaneously formed by evaporation and lift-off so that the transmission line is obtained.

In the twenty-ninth embodiment, a transmission line constituting a line impedance matching circuit can be obtained.

Embodiment 30

Figure 41:
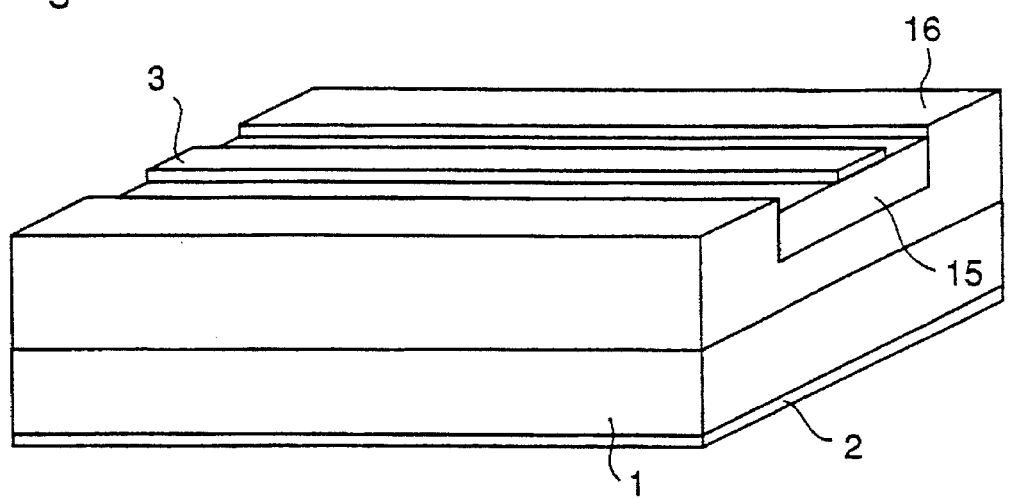
FIG. 41 is a perspective view illustrating a transmission line having high isolation according to a thirtieth embodiment of the present invention.
Figure 42:
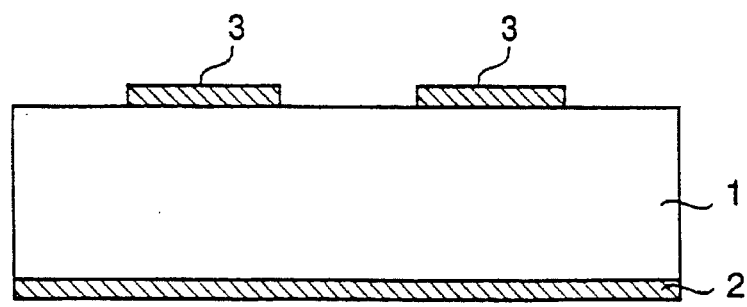
FIG. 42 is a diagram illustrating prior art microstrip transmission lines.
Figure 43:
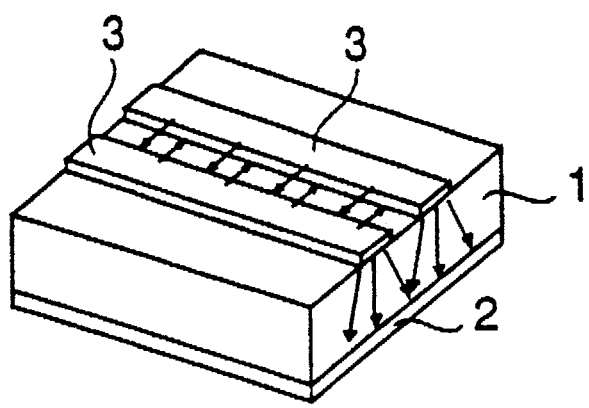
FIGS. 43(a)–43(b) are perspective views illustrating difficulties associated with the prior art microstrip transmission line or another example of the prior art microstrip line.
Figure 43:
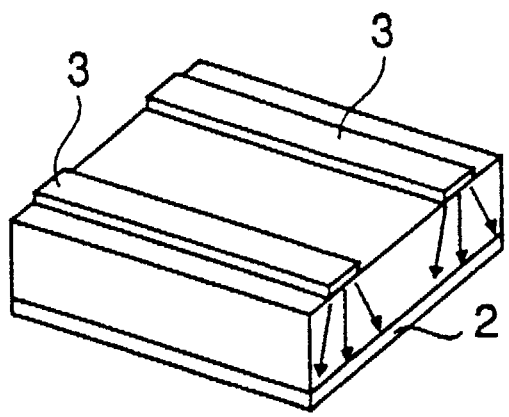

FIG. 41 is a perspective view illustrating a structure of a transmission line having high isolation according to a thirtieth embodiment of the present invention.

The transmission line of the thirtieth embodiment having high isolation is the same as the one in the sixteenth embodiment except that the burying dielectric 5 filling the groove is replaced with the dielectric 15 having homogeneous conductivity using the same method in the fifteenth embodiment. Because of this structure, a transmission line constituting a transmission line type attenuator for an ultra high frequency wave can be obtained.

What is claimed is:

1. A transmission line comprising:

a dielectric or semi-insulating substrate having a front surface and a rear surface;

a groove having bottom and lateral surfaces in the substrate at the front surface of the substrate;

a first metallization film disposed on the bottom and the lateral surfaces of the groove;

a dielectric filling the groove and making contact with the first metallization film;

a wiring conductor film disposed on the dielectric;

a grounding metallization film disposed on the rear surface of the substrate; and a via hole penetrating from the rear surface of the substrate and connecting the first metallization film disposed on the bottom surface of the groove to the grounding metallization film on the rear surface of the substrate.

2. A plurality of transmission lines comprising:

a dielectric or semi-insulating substrate having a front surface and a rear surface;

a plurality of grooves, each groove having bottom and lateral surfaces in the substrate at the front surface of the substrate;

a first metallization film disposed on the bottom and the lateral surfaces of the grooves;

dielectrics filling the grooves and making contact with the first metallization film;

wiring conductor films disposed on the dielectrics;

a grounding metallization film disposed on the rear surface of the substrate, each transmission line comprising a respective groove, a respective first metallization film in each respective groove, a dielectric in each respective groove, and a respective wiring conductor film on each dielectric, wherein at least two different dielectrics are disposed in respective grooves so that the dielectrics differ from one groove to another.

3. A transmission line comprising:

a dielectric or semi-insulating substrate having a front surface and a rear surface;

a groove having bottom and lateral surfaces in the substrate at the front surface of the substrate;

a first metallization film disposed on the bottom and the lateral surfaces of the groove;

a first dielectric filling the groove and making contact with the first metallization film;

a wiring conductor film disposed on the first dielectric;

a grounding metallization film disposed on the rear surface of the substrate;

a second dielectric in contact with the first dielectric and the wiring conductor; and a second metallization film covering the second dielectric, the second metallization film being disposed on and electrically connected to the first metallization film.

4. The transmission line of claim 1 further comprising:

a second dielectric disposed on the dielectric and the wiring conductor; and a second metallization film disposed on and covering the second dielectric, the second metallization film being electrically connected to the first metallization film.

5. The transmission line of claim 2 further comprising:

a second dielectric disposed on the dielectric and the wiring conductor; and a second metallization film disposed on and covering the second dielectric, the second metallization film being electrically connected to the first metallization film.

6. The transmission line of claim 3 wherein the second dielectric is air.

7. A transmission line comprising:

a dielectric or semi-insulating substrate having a front surface and a rear surface;

a groove having bottom and lateral surfaces in the substrate at the front surface of the substrate:

a first metallization film disposed on the bottom and the lateral surfaces of the groove;

a dielectric filling the groove and making contact with the first metallization film;

a wiring conductor film disposed on the dielectric;

a grounding metallization film disposed on the rear surface of the substrate, wherein the transmission line has a characteristic impedance; and an electrically conductive segment in the dielectric in the groove at an end of the transmission line and having a resistance matching the characteristic impedance of the transmission line for terminating the transmission line.

8. A transmission line comprising:

a dielectric or semi-insulating substrate having a front surface and a rear surface;

a groove having bottom and lateral surfaces in the substrate at the front surface of the substrate;

a first metallization film disposed on the bottom and the lateral surfaces of the groove;

a dielectric filling the groove and making contact with the first metallization film;

a wiring conductor film disposed on the dielectric;

a grounding metallization film disposed on the rear surface of the substrate; and a metal segment part of the dielectric in the groove at an end of the transmission line short-circuiting the wiring conductor film and the first metallization film as a shorted stub transmission line.

9. A transmission line comprising:

a dielectric or semi-insulating substrate having a front surface and a rear surface;

a groove having bottom and lateral surfaces in the substrate at the front surface of the substrate;

a first metallization film disposed on the bottom and the lateral surfaces of the groove;

a dielectric filling the groove and making contact with the first metallization film;

a wiring conductor film disposed on the dielectric;

a grounding metallization film disposed on the rear surface of the substrate, wherein the wiring conductor film has a length shorter than the groove as an open stub transmission line.

10. A transmission line comprising:

a dielectric or semi-insulating substrate having a front surface and a rear surface;

a groove having bottom and lateral surfaces in the substrate at the front surface of the substrate;

a first metallization film disposed on the bottom and the lateral surfaces of the groove;

a dielectric filling the groove and making contact with the first metallization film;

a wiring conductor film disposed on the dielectric;

a grounding metallization film disposed on the rear surface of the substrate, wherein the transmission line comprising the groove, the first metallization film, the dielectric, and the wiring conductor film branches into an T-shape.

11. A transmission line comprising:

a dielectric or semi-insulating substrate having a front surface and a rear surface;

a groove having bottom and lateral surfaces in the substrate at the front surface of the substrate;

a first metallization film disposed on the bottom and the lateral surfaces of the groove:

a dielectric filling the groove and making contact with the first metallization film;

a wiring conductor film disposed on the dielectric;

a grounding metallization film disposed on the rear surface of the substrate;

a first microstrip line disposed in the vicinity of the transmission line;

a second microstrip line having a length equal to $(\frac{1}{4})\lambda$ and a characteristic impedance of $Z_c=[(Z_{o1})(Z_{o2})]^{1/2}$, disposed between the transmission line and the first microstrip line wherein the second microstrip line connects the transmission line to the first microstrip line, where $Z_{o1}$ represents a characteristic impedance of the burying dielectric line and $Z_{o2}$ represents a characteristic impedance of the first microstrip line.

12. A transmission line comprising;

a dielectric or semi-insulating substrate having a front surface and a rear surface;

a groove having bottom and lateral surfaces in the substrate at the front surface of the substrate;

a first metallization film disposed on the bottom and the lateral surfaces of the groove;

a dielectric filling the groove and making contact with the first metallization film;

a wiring conductor film disposed on the dielectric;

a grounding metallization film disposed on the rear surface of the substrate, wherein the dielectric filling the groove is homogeneous in electrical conductivity as a lossy line attenuator.

13. A transmission line comprising:

a dielectric or semi-insulating substrate having a front surface and a rear surface;

a metallization layer on the front surface of the substrate;

a groove having bottom and lateral surfaces in the metallization layer;

a dielectric filling the groove; and a wiring conductor film disposed on the the dielectric.

14. The transmission line of claim 13 further comprising a via hole penetrating from the rear surface of the substrate and connected to the metallization layer disposed on the front surface of the substrate.

15. The transmission line of claim 13 including:

a plurality of transmission lines on the metallization layer, each transmission line comprising a respective groove, a dielectric in each groove, and a respective wiring conductor on each dielectric; and a grounding metallization film disposed on the rear surface of the substrate wherein at least two different dielectrics are disposed in respective grooves so that the dielectrics differ from one groove to another.

16. The transmission line of claim 13 further comprising:

a second dielectric in contact with the dielectric and the wiring conductor; and a second metallization film covering the second dielectric, the second metallization film being disposed on and electrically connected to the first metallization film.

17. The transmission line of claim 14 further comprising:

a second dielectric disposed on the dielectric and the wiring conductor; and a second metallization film disposed on and covering the second dielectric, the second metallization film and the metallization layer being connected.

18. The transmission line of claim 1 comprising:

a second dielectric disposed on the dielectric and the wiring conductor; and a second metallization film disposed on and covering the second dielectric, the second metallization film and the metallization layer being connected.

19. The transmission line of claim 16 wherein the second dielectric is air.

20. The transmission line of claim 13 wherein the transmission line has a characteristic impedance and further comprising an electrically conductive segment in the dielectric in the groove at an end of the transmission line and having a resistance matching the characteristic impedance of the transmission line for terminating the transmission line.

21. The transmission line of claim 13 further comprising a metal segment part of the dielectric in the groove at an end of the transmission line short-circuiting the wiring conductor film and the metallization layer as a shorted stub transmission line.

22. The transmission line of claim 13 wherein the wiring conductor film has a length shorter than the groove as an open stub a transmission line.

23. The transmission line of claim 13 wherein the transmission line comprising the groove, the dielectric, and the wiring conductor film branches into a T-shape.

24. The transmission line of claim 13 further comprising:

a first microstrip line disposed in the vicinity of the transmission line;

a second microstrip line having a line length of $(\frac{1}{4})\lambda$ and a characteristic impedance of $Z_c=[(Z_{o1})(Z_{o2})]^{1/2}$, disposed between the transmission line and the first microstrip line wherein the second microstrip line connects the transmission line to the first microstrip line, where $Z_{o1}$ represents a characteristic impedance of the burying dielectric line and $Z_{o2}$ represents a characteristic impedance of the first microstrip line.

25. The transmission line of claim 13 wherein the dielectric filling the groove is homogeneous in electrical conductivity as a lossy line attenuator.

26. A method of fabricating a transmission line comprising:

preparing a dielectric or a semi-insulating substrate having a front surface and a rear surface;

forming a metallization layer on the front surface of the substrate;

forming a groove having bottom and lateral surfaces in the metallization layer at the front surface;

filling the groove with a dielectric;

forming a wiring conductor film on the dielectric; and forming a grounding metallization film on the rear surface of the substrate.

27. The method of claim 26 further comprising forming a via hole from the grounding metallization on the rear surface of the substrate to the metallization layer on the front surface of the substrate.

28. The method of claim 26 further comprising forming a plurality of transmission lines on the metallization layer, each transmission line comprising a respective groove, a dielectric in each groove, and a respective wiring conductor on each dielectric wherein dielectrics differ from one groove to another.

29. The method of claim 26 further comprising:

forming a second dielectric on the dielectric and the wiring conductor; and forming a second metallization film on the second dielectric electrically connected to the metallization layer.

30. The method claim 26 further comprising removing a part of the dielectric filling the groove at an end of the transmission line and substituting an electrically conductive segment having a resistance matching the characteristic impedance of the transmission line for terminating the transmission line.

31. The method of claim 26 comprising removing a part of the dielectric filling the groove at an end of the transmission line and substituting a metal electrically short-circuiting the wiring conductor film and the first metallization film as a shorted stub.

32. The method of claim 26 including forming the wiring conductor to have a length less than that of the groove as an open stub.

33. The method of claim 26 including forming the groove, the dielectric, and the wiring conductor film into a T-shape as a T-shaped branch circuit.

34. The method of claim 26 further comprising:

forming a first microstrip line in the vicinity of the transmission line; and forming a second microstrip line having a line length of $(¼)\lambda$ and having a characteristic impedance of $Z_c = [(Z_{o1})(Z_{o2})]^{1/2}$ between the transmission line and the first microstrip line, where $Z_{o1}$ represents a characteristic impedance of the burying dielectric line and $Z_{o2}$ represents a characteristic impedance of the first microstrip line, so that the second microstrip line connects the transmission line to the first microstrip line.

35. The method of claim 26 including filling the groove with a dielectric having homogeneous electrical conductivity as a lossy ling attenuator.

* * * * *